(12) United States Patent
Shih et al.

(10) Patent No.: US 11,189,627 B2
(45) Date of Patent: Nov. 30, 2021

(54) METHOD TO REDUCE KINK EFFECT IN SEMICONDUCTOR DEVICES

(71) Applicant: Taiwan Semiconductor Manufacturing Co., Ltd., Hsin-Chu (TW)

(72) Inventors: Hung-Ling Shih, Tainan (TW); Chieh-Fei Chiu, Tainan (TW); Po-Wei Liu, Tainan (TW); Wen-Tuo Huang, Tainan (TW); Yu-Ling Hsu, Tainan (TW); Yong-Shiuan Tsair, Tainan (TW); Shih Kuang Yang, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/822,315

(22) Filed: Mar. 18, 2020

(65) Prior Publication Data

US 2020/0219892 A1 Jul. 9, 2020

Related U.S. Application Data

(62) Division of application No. 15/981,056, filed on May 16, 2018, now Pat. No. 10,680,002.

(51) Int. Cl.
*H01L 29/778* (2006.01)
*H01L 27/11521* (2017.01)
(Continued)

(52) U.S. Cl.
CPC .... *H01L 27/11521* (2013.01); *H01L 21/0274* (2013.01); *H01L 21/3085* (2013.01);
(Continued)

(58) Field of Classification Search
CPC ......... H01L 27/11521; H01L 29/40114; H01L 21/0274; H01L 21/3085; H01L 21/76224; H01L 21/76877; H01L 29/788
See application file for complete search history.

(56) References Cited

U.S. PATENT DOCUMENTS

| 5,622,881 A * | 4/1997 | Acocella | H01L 27/115 438/264 |
|---|---|---|---|
| 2007/0026651 A1 | 2/2007 | Leam et al. | |

(Continued)

FOREIGN PATENT DOCUMENTS

| CN | 104103592 A | 10/2014 |
|---|---|---|
| KR | 20030002352 A * | 1/2003 |

OTHER PUBLICATIONS

Hagimoto, et al. "Evaluation of the Plasmaless Gaseous Etching Process." Solid State Phenomena vol. 134 (2008) pp. 7-10.
(Continued)

*Primary Examiner* — Eric A. Ward
*Assistant Examiner* — Dmitriy Yemelyanov
(74) *Attorney, Agent, or Firm* — Eschweiler & Potashnik, LLC

(57) ABSTRACT

In some embodiments, a method for forming a semiconductor device is provided. The method includes forming a pad stack over a semiconductor substrate, where the pad stack includes a lower pad layer and an upper pad layer. An isolation structure having a pair of isolation segments separated in a first direction by the pad stack is formed in the semiconductor substrate. The upper pad is removed to form an opening, where the isolation segments respectively have opposing sidewalls in the opening that slant at a first angle. A first etch is performed that partially removes the lower pad layer and isolation segments in the opening so the opposing sidewalls slant at a second angle greater than the first angle. A second etch is performed to round the opposing sidewalls and remove the lower pad layer from the opening. A floating gate is formed in the opening.

20 Claims, 17 Drawing Sheets

(51) Int. Cl.
*H01L 29/788* (2006.01)
*H01L 21/308* (2006.01)
*H01L 21/768* (2006.01)
*H01L 21/027* (2006.01)
*H01L 21/762* (2006.01)
*H01L 21/28* (2006.01)

(52) U.S. Cl.
CPC .. *H01L 21/76224* (2013.01); *H01L 21/76877* (2013.01); *H01L 29/40114* (2019.08); *H01L 29/788* (2013.01)

(56) References Cited

U.S. PATENT DOCUMENTS

| | | |
|---|---|---|
| 2008/0116493 A1 | 5/2008 | Adkisson et al. |
| 2015/0263123 A1 | 9/2015 | Cheng et al. |
| 2016/0218110 A1* | 7/2016 | Yang ................ H01L 29/42328 |

OTHER PUBLICATIONS

Non-Final Office Action dated Sep. 10, 2019 for U.S. Appl. No. 15/981,056.
Notice of Allowance dated Jan. 29, 2020 for U.S. Appl. No. 15/981,056.

\* cited by examiner

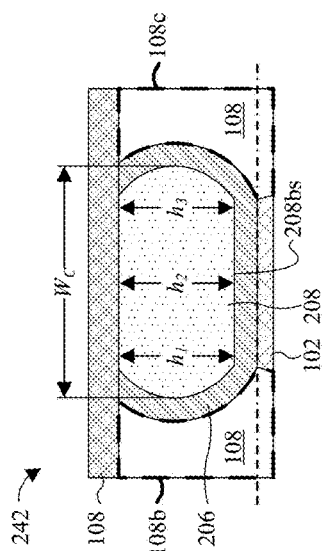
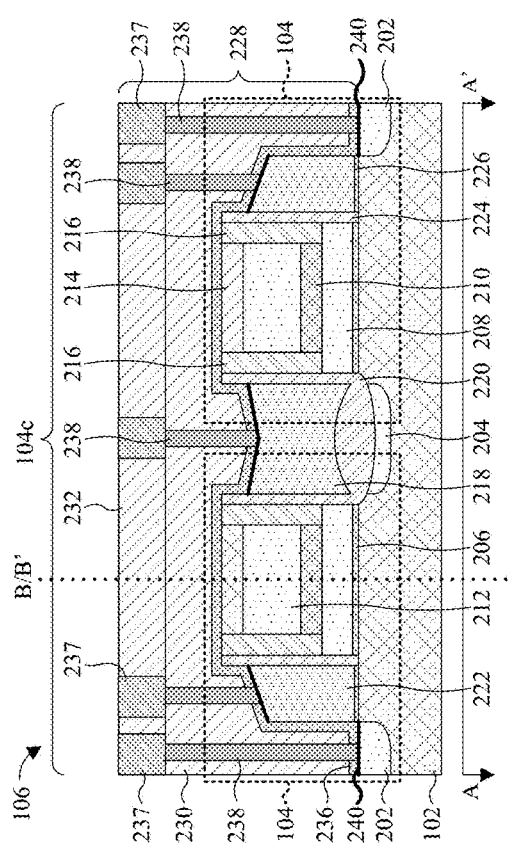
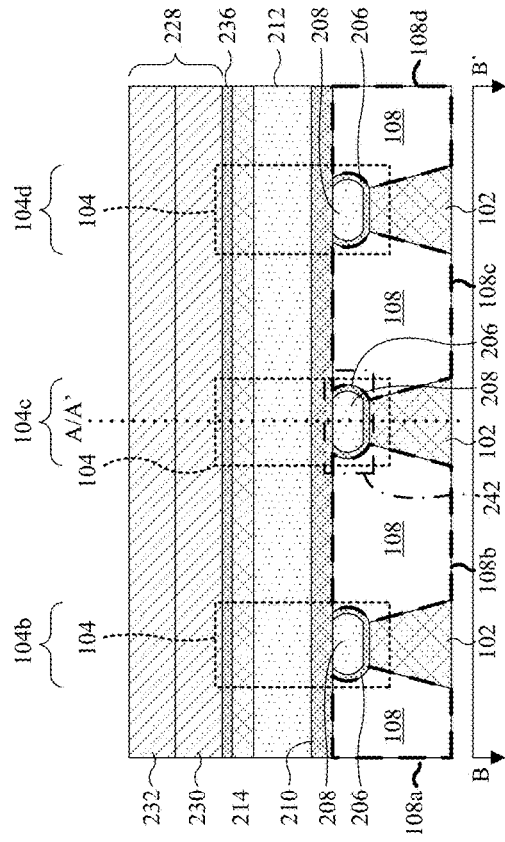
Fig. 2C
Fig. 2A
Fig. 2B

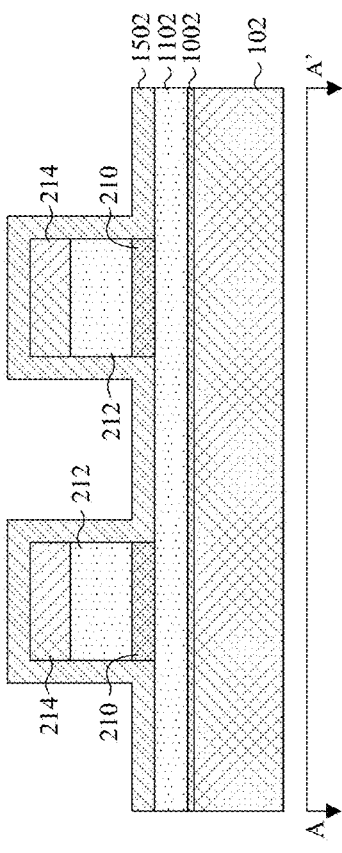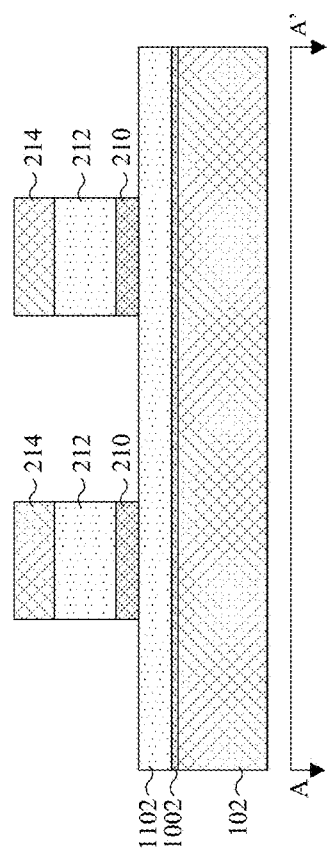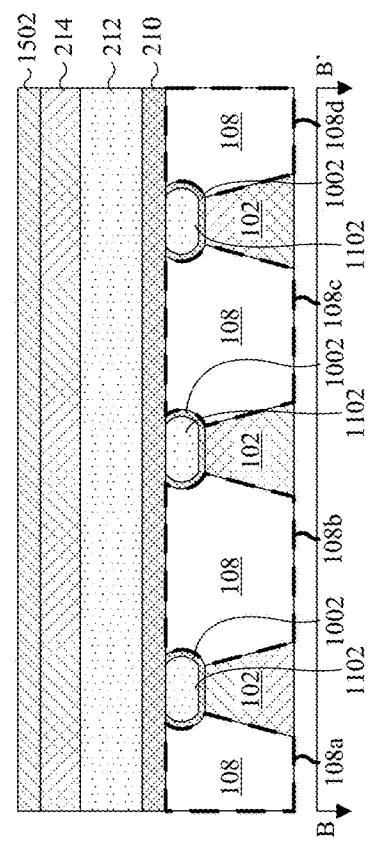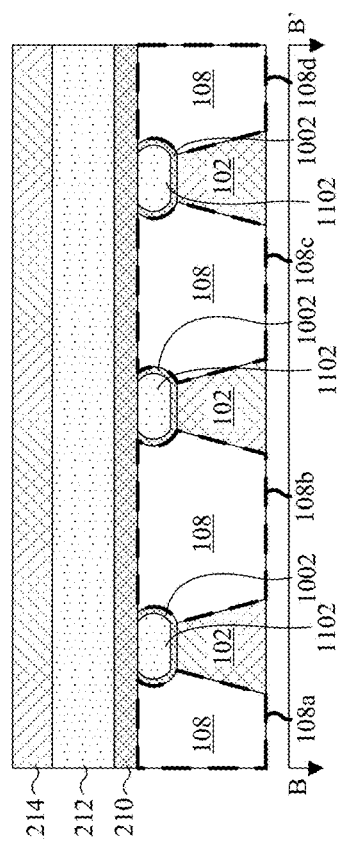

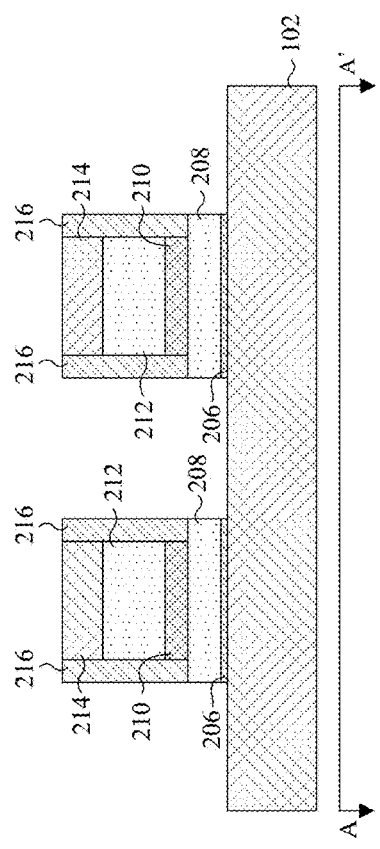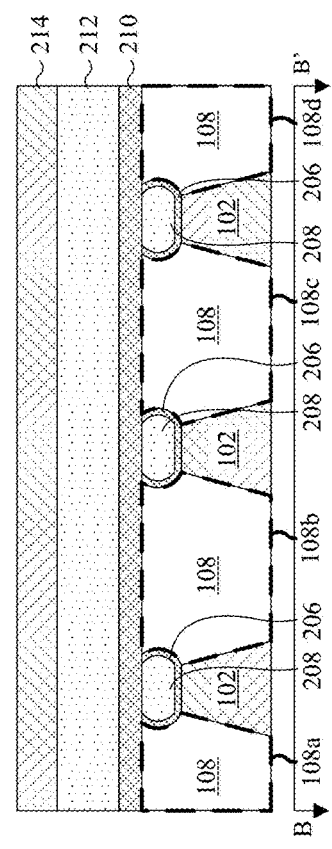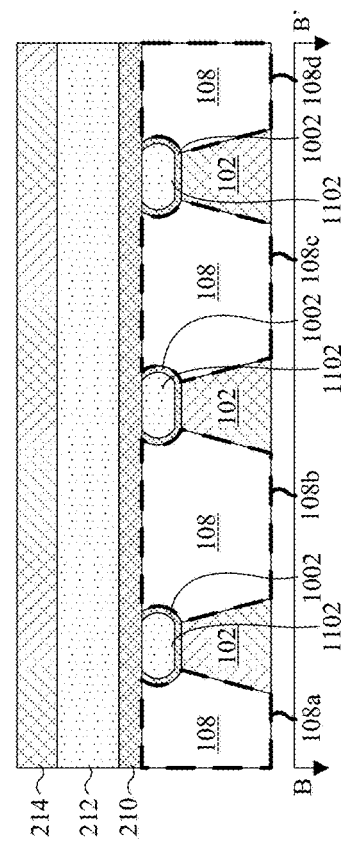
Fig. 16A
Fig. 17A
Fig. 16B
Fig. 17B

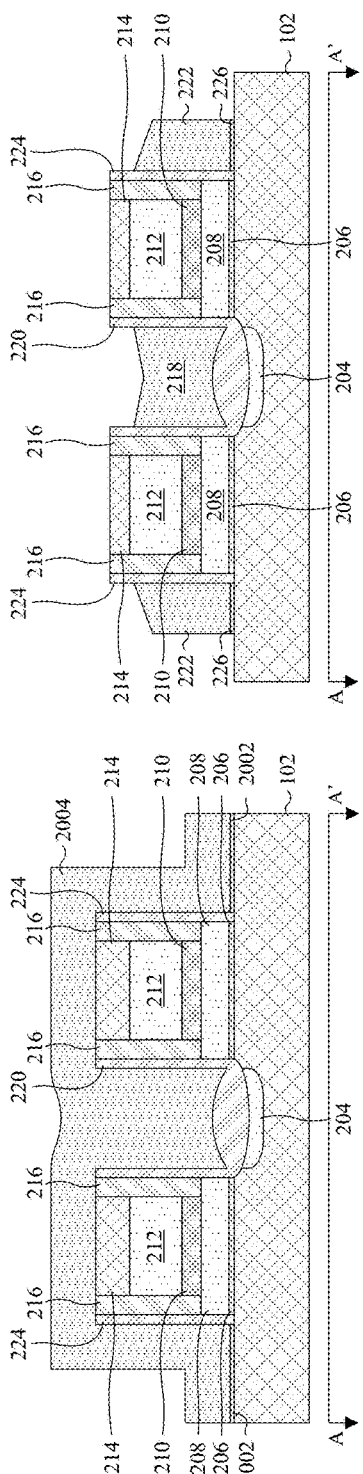
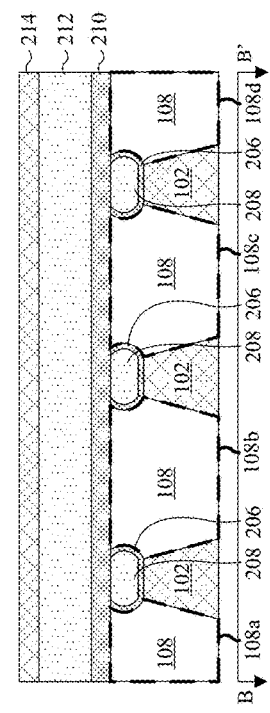
Fig. 21B
Fig. 20B
Fig. 21A
Fig. 20A
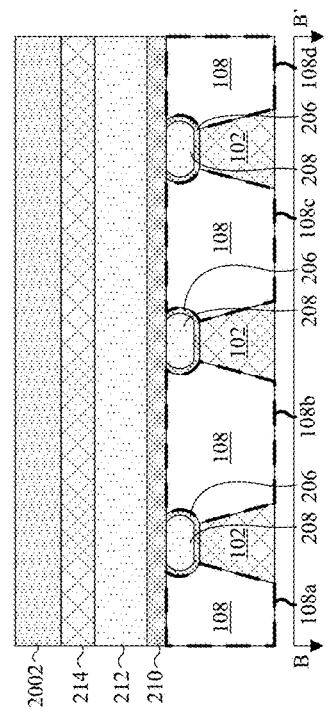

METHOD TO REDUCE KINK EFFECT IN SEMICONDUCTOR DEVICES

REFERENCE TO RELATED APPLICATION

This application is a Divisional of U.S. application Ser. No. 15/981,056, filed on May 16, 2018, the contents of which are hereby incorporated by reference in their entirety.

BACKGROUND

Flash memory is an electronic non-volatile computer storage medium that can be electrically erased and reprogrammed. It is used in a wide variety of electronic devices and equipment. To store information, flash memory includes an addressable array of memory cells, typically made from floating gate transistors. Common types of flash memory cells include stacked gate memory cells and split gate flash memory cells (e.g., the third generation SUPERFLASH (ESF3) memory cell). Split gate flash memory cells have several advantages over stacked gate memory cells, such as lower power consumption, higher injection efficiency, less susceptibility to short channel effects, and over erase immunity.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A illustrates a cross-sectional view of some embodiments of a region of the memory cell array taken along line A-A' of FIG. 1.

FIG. 2B illustrates a cross-sectional view of some embodiments of a region of the memory cell array taken along line B-B' of FIG. 1.

FIG. 2C illustrates a magnified cross-sectional view of some embodiments of a portion of the region of the memory cell array illustrated in FIG. 2B.

FIGS. 3A and 3B through 26A and 26B illustrate a series of cross-sectional views of some embodiments of a method for forming a pair of memory cells comprising floating gates with substantially flat bottom surfaces.

DETAILED DESCRIPTION

Figure 1:
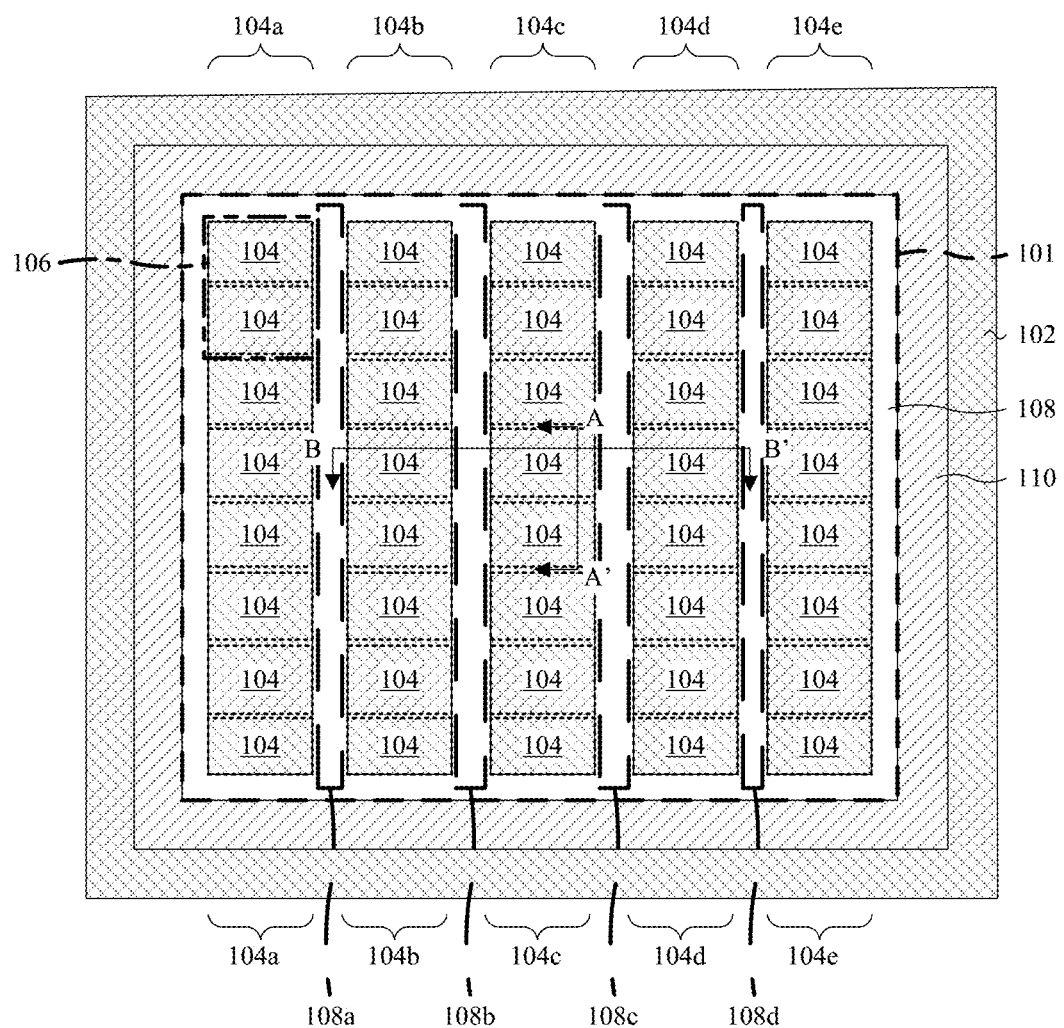
FIG. 1 illustrates a top view of some embodiments of a memory cell array having a plurality of memory cells comprising floating gates with substantially flat bottom surfaces.

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some split gate flash memory cells include a select gate and a floating gate arranged over a semiconductor substrate between a pair of source/drain regions disposed in the semiconductor substrate and separated in a first direction. An erase gate is arranged over one of the source/drain regions, and the floating gate is arranged between the erase gate and the select gate. A control gate is arranged over the floating gate. To prevent leakage current from adversely affecting the operation of adjacent memory cells (or other integrated devices), shallow trench isolation (STI) structures may be disposed within the semiconductor substrate and separate individual split gate flash memory cells.

According to a process for forming the floating gate, a lower pad layer (e.g., pad oxide) and an upper pad layer (e.g., pad nitride) are formed stacked over a substrate, and subsequently patterned with a layout of the STI structures. The substrate is etched with the lower and upper pad layers in place to form trenches, and the trenches are formed with one or more dielectric materials (such as silicon dioxide or silicon nitride) to form the STI structures. The upper pad layer is removed between a pair of STI structures to form an opening, and the lower pad layer is subsequently removed from the opening by a wet etch. A conductive layer is formed covering the STI structures and filling the opening, and a planarization is subsequently performed into the conductive layer until the STI structures are reached. The conductive layer is then patterned into the floating gate by an etching process.

The speed with which a split gate flash memory cell is erased is an important criterion for the performance of the split gate flash memory cell. One approach to improve the erase speed of a split gate flash memory cell is to increase a critical width of the floating gate in a second direction transverse the first direction. By increasing the critical width of the floating gate, the occurrence of Fowler-Nordheim tunneling between the floating gate and the erase gate may be increased. Typically, the critical width is increased by increasing an etch time of the wet etch used to remove the lower pad layer. For example, an anisotropic wet etch may be utilized to remove the lower pad layer. The anisotropic wet etch may be performed for a first etch time. The first etch time may be sufficient to remove the lower pad layer, but insufficient to increase the width of the opening to the critical width. Thus, the first etch time may be extended to a second etch time to allow the anisotropic wet etch to increase the width of the opening to the critical width. However, by extending the etch time to the second etch time, divots may form in upper surfaces of the STI structures due to the anisotropic wet etch removing the lower pad layer and over etching into the STI structures.

The divots can negatively impact electrical behavior (e.g., both threshold and sub-threshold voltages) of adjacent memory cells (and/or devices), leading to unpredictable performance. For example, the floating gate may fill the divots causing the floating gate to have sharp edges that may enhance an electric field generated during operation of the split gate memory cell. The enhanced electrical field reduces a threshold voltage of the split gate memory cell, resulting in a problem called the kink effect (e.g., defined by a double hump in a drain current vs. gate voltage relation). The kink effect has a number of negative consequences, such as adversely affecting the reliability of split gate memory cells (e.g., increased errors during program/erase cycles) and being difficult to model (e.g., in SPICE curve fitting and/or parameter extraction).

The present disclosure, in some embodiments, relates to a method of forming a semiconductor device comprising a floating gate having an increased critical width while reducing the susceptibility of the semiconductor device to performance degradation (e.g., the kink effect) caused by divots in adjacent isolation structures. The method comprises forming an isolation structure in the semiconductor substrate, where the isolation structure includes a pair of isolation segments separated in a first direction by a pad stack. The pad stack includes a lower pad layer and an upper pad layer. The upper pad layer is removed to form an opening, where the isolation segments have opposing sidewalk in the opening that are slanted at a first angle relative to a top surface of the lower pad layer. A first etch is performed to partially remove the lower pad layer and the isolation segments in the opening so that the opposing sidewalls are slanted at a second angle greater than the first angle. A second etch is performed to round the opposing sidewalk and to remove the lower pad layer from the opening. A conductive layer is formed filling the opening.

Because a first etch partially removes the lower pad layer and the solation segments in the opening and a second etch removes the lower pad layer and rounds the opposing sidewalls of the opening, the opening may have an increased width in the second direction and a substantially planar bottom surface. Because the first etch enlarges the opening prior to the second etch, the second etch may be performed for an etch time that is sufficient to remove the lower pad layer and also sufficient to increase the width of the opening to the increased critical width. Thus, the second etch may increase the width of the opening and remove the lower pad layer without over etching into the isolation structure. Accordingly, the critical width of the floating gate in the second direction is increased while also reducing the adverse effects that divots may cause on the semiconductor device or adjacent semiconductor devices).

FIG. 1 illustrates a top view of some embodiments of a memory cell array having a plurality of memory cells comprising floating gates with substantially flat bottom surfaces.

As shown in FIG. 1, an integrated circuit (IC) comprising a memory cell array 101 arranged over/within a semiconductor substrate 102 is provided. The memory cell array 101 comprises a plurality of memory cells 104. In some embodiments, the plurality of memory cells 104 may be arranged as a pair of memory cells 106. In further embodiments, the memory cell array 101 may be a split gate flash memory cell array, and the plurality of memory cells 104 may be a plurality of split gate flash memory cells. Further, the plurality of memory cells 104 may be arranged in a plurality of columns and rows. For example, a plurality of memory cells 104 may be arranged in a plurality of columns of memory cells 104a-104e.

An isolation structure 108 is disposed within the semiconductor substrate 102 and between memory cells 104. In some embodiments, the isolation structure 108 comprises a plurality of isolation segments 108a-108d that laterally separate the plurality of columns of memory cells 104a-104e. In yet further embodiments, a dummy poly ring 110 may surround the memory cell array 101.

FIG. 2A illustrates a cross-sectional view of some embodiments of a region of the memory cell array taken along line A-A' of FIG. 1. FIG. 2B illustrates a cross-sectional view of some embodiments of a region of the memory cell array taken along line B-B' of FIG. 1. FIG. 2C illustrates a magnified cross-sectional view of some embodiments of a portion 242 of e region of the memory cell array illustrated in FIG. B.

As shown in FIG. 2A, a pair of memory cells 106 is arranged over/within the semiconductor substrate 102. The pair of memory cells 106 comprises two memory cells 104. In some embodiments, the memory cells 104 are similar to one another. Thus, for ease of illustration, features present in both memory cells 104 may only be labeled on one of the two memory cells 104. Further, for clarity, line B/B' illustrates the plane upon which line B-B' cuts through the pair of memory cells 106.

The memory cells 104 comprise a pair of individual source/drain regions 202 and a common source/drain region 204. The individual source/drain regions 202 and the common source/drain region 204 are disposed in the semiconductor substrate 102. Further, the individual source/drain regions 202 are spaced from the common source/drain region 204 on opposite sides of the common source/drain region 204 in a first direction. In some embodiments, the individual source/drain regions 202 and the common source/drain region 204 may comprise a first doping type (e.g., n-type or p-type).

A pair of floating gate dielectric layers 206, a pair of floating gates 208, a pair of control gate dielectric layers 210, a pair of control gates 212 and a pair of control gate hard masks 214 are respectively stacked between a first one of the individual source/drain regions 202 and the common source/drain region 204 and between a second one of the individual source/drain regions 202 and the common source/drain region 204. The floating gate dielectric layers 206 are respectively disposed over the semiconductor substrate 102 and may comprise, for example, an oxide, some other suitable dielectric, or a combination of the forgoing. The floating gates 208 are respectively disposed over the floating gate dielectric layers 206 and may comprise, for example, metal, doped polysilicon, or some other suitable conductor(s). The control gate dielectric layers 210 are respectively disposed over the floating gates 208 and may comprise, for example, an oxide, a nitride, some other suitable dielectric, or a combination of the foregoing. The control gates 212 are respectively disposed over the control gate dielectric layers 210 and may comprise, for example, metal, doped polysilicon, or some other suitable conductor. The control gate hard masks 214 are respectively disposed over the control gates 212 and may comprise, for example, an oxide, a nitride, some other suitable dielectric, or a combination of the foregoing.

A control gate spacer 216 is respectively disposed over each of the floating gates 208, and the control gate spacer 216 comprises multiple segments that respectively line sidewalls of the control gate dielectric layers 210, sidewalls of the control gates 212, and sidewalls of the control gate hard masks 214. The control gate spacer 216 may comprise, for example, an oxide, a nitride, some other suitable dielectric, or a combination of the foregoing.

An erase gate 218 is disposed over the common source/drain region 204 and between the floating gates 208. Further, the erase gate 218 is separated from the common source/drain region 204 and the floating gates 208 by an erase gate dielectric layer 220. The erase gate dielectric layer 220 lines the erase gate 208, such that the erase gate dielectric layer 220 lines a bottom surface of the erase gate 218 and sidewalls of the erase gate 218. The erase gate 218 may comprise, for example, metal, doped polysilicon, or some other suitable conductive material. The erase gate dielectric layer 220 may comprise, for example, a dioxide, some other suitable dielectric, or a combination of the foregoing.

A pair of select gates 222 are disposed over the semiconductor substrate 102. The select gates 222 are respectively disposed between the first one of the individual source/drain regions 202 and a first one of the floating gates 208 and between the second one of the individual source/drain regions 202 and a second one of the floating gates 208. Further, the select gates 222 are laterally spaced from the floating gates 208 by floating gate spacers 224, respectively. Each of the floating gate spacers 224 comprise multiple segments that respectively line sidewalls of the floating gate dielectric layers 206, sidewalls of the floating gates 208, and sidewalls of the control gate spacers 216 respectively facing the select gates 222. Moreover, the select gates 222 are vertically separated from the semiconductor substrate 102 by a pair of select gate dielectric layers 226. The select gates 222 may comprise, for example, metal, doped polysilicon, or some other suitable conductive material. The floating gate spacers 224 may comprise, for example, an oxide, a nitride, some other suitable dielectric, or a combination of the foregoing. The select gate dielectric layers 226 may comprise, for example, an oxide, some other suitable dielectric, or a combination of the foregoing.

An interconnect structure 228 is disposed over the memory cells 104. The interconnect structure 228 may comprise an interlayer dielectric (ILD) layer 230 and an intermetal dielectric (IMD) layer 232 disposed over the ILD layer 230. The ILD layer 230 and the IMD layer 232 may comprise, for example, an oxide, a nitride, an oxynitride, a low κ dielectric, some other suitable dielectric(s), or a combination of the foregoing. In some embodiments, a contract etch stop layer (CESL) 236 is disposed over and conforms to the memory cells 104, such that the CESL 236 is disposed between top surfaces of the memory cells 104 and the ILD layer 230. In further embodiments, the IMD layer 232 comprises a plurality of IMD layers. In yet further embodiments, a passivation layer (not shown) is disposed over the plurality of IMD layers, and may comprise, for example, an oxide, a nitride, an oxynitride, a polymer, some other suitable material, or a combination of the foregoing.

A plurality of conductive lines 237 and a plurality of conductive vias 238 are disposed within the interconnect structure 228. The conductive vias 238 respectively extend from conductive lines 237 through the ILD layer 230 to the individual source/drain regions 202, the select gates 222, and the erase gate 218. The conductive lines 237 are disposed in the IMD layer 232 and over the ILD layer 230. The conductive lines 237 and conductive vias 238 may comprise, for example, copper, aluminum, tungsten, some other suitable conductor, or a combination of the foregoing.

In some embodiments, a plurality of silicide pads 240 are disposed on top surfaces of the individual source/drain regions 202, top surfaces of the select gates 222, and a top surface of the erase gate 218. The silicide pads 240 may comprise, for example, nickel silicide, titanium silicide, cobalt silicide, tungsten silicide, or some other suitable silicide.

As shown in FIG. 2B, an isolation structure 108 is disposed within the semiconductor substrate 102 and extends beyond an upper surface of the semiconductor substrate 102. The isolation structure may, for example, be a shallow trench isolation (STI) structure, a deep trench isolation (DTI) structure, or some other suitable isolation structure(s). For clarity, line A/A' illustrates the plane upon which line A-A' cuts through the pair of memory cells 106.

The plurality of isolation segments 108a-108d laterally separate the plurality of columns of memory cells 104a-104e, respectively, in a second direction transverse to the first direction (e.g., transverse to the direction in which the individual source/drain regions 202 are spaced from the common source/drain region 204). In some embodiments, the plurality of isolation segments 108a-108d have an upper surface that is substantially planar with upper surfaces of the floating gates 208 and upper surfaces of the floating gate dielectric layers 206. In further embodiments, the top surface of the isolation structures contact a bottom surface of the control gate dielectric layers 210.

The floating gates 208 are respectively separated from the plurality of isolation segments 108a-108d and the semiconductor substrate 102 by the floating gate dielectric layers 206. In some embodiments, the floating gate dielectric layers 206 conformally line the sidewalls of the floating gates 208. In further embodiments, a bottom surface of the floating gate dielectric layers 206 contact top surfaces of the semiconductor substrate 102. In yet further embodiments, bottom surfaces of the floating gate dielectric layers 206 are substantially planar.

As shown in FIG. 2C, the floating gates 208 have substantially planar bottom surfaces 208bs. With regards to the bottom surfaces 208bs, substantially planar is defined as having a variation between an uppermost point of a first bottom surface 208bs and a lowermost point of the first bottom surface 208bs that is less than about ten angstroms. The floating gate 208 has opposing sidewalls spaced in the second direction and extending from the planar bottom surface 208bs to an upper surface of the floating gate 208. In some embodiments, the opposing sidewalls extend from the substantially planar bottom surface 208bs at an obtuse angle and arch towards the upper surface of the floating gate. The floating gate 208 has a critical width $W_C$ measured between outermost points of the opposing sidewalls. Further, the floating gate 208 has a height between about 280 angstrom and about 430 angstrom. More specifically, the floating gate 208 may have a first height $h_1$ measured near a first end of the floating gate 208 between about 290 angstrom and 430 angstrom, a second height $h_2$ measured near a center point of the floating gate 208 between about 280 angstrom and 420 angstrom, and a third height $h_3$ measured near a second end opposite the first end of the floating gate 208 between about 290 angstrom and about 430 angstrom. As seen hereafter, divot formation in the isolation structure 108 is reduced or eliminated, such that the floating gate 208 has a substantially planar bottom surface 208bs. Accordingly, the negative effects on electrical behavior of memory cells 104 (and/or other adjacent devices) caused by divots forming in the isolation segments 108a-108d and subsequently causing the floating gates 208 to have bottom surfaces with sharp edges may be reduced.

FIGS. 3A and 3B through 26A and 26B illustrate a series of cross-sectional views of some embodiments of a method for forming a pair of memory cells comprising floating gates with substantially flat bottom surfaces. Figures with a suffix of "A" are taken along line A-A' of FIG. 1. Figures with a suffix of "B" are taken along line B-B' of FIG. 1.

Figure 3A:
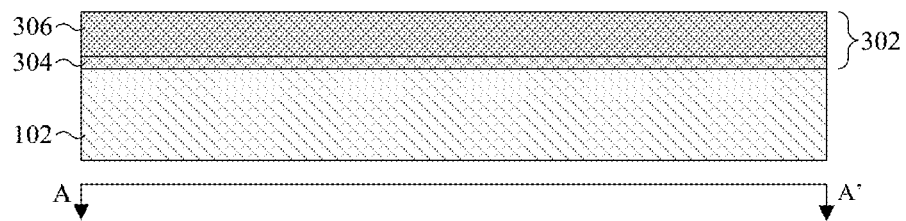
Figure 3B:
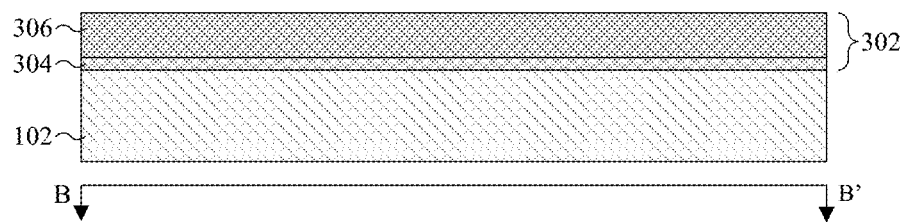

As shown in FIGS. 3A-3B, a pad stack 302 is formed over a semiconductor substrate 102. The semiconductor substrate 102 may comprise, for example, a bulk silicon substrate, a silicon-on-insulator (SOI) substrate, or some other suitable semiconductor substrate(s). The pad stack 302 comprises a lower pad layer 304 that separates an upper pad layer 306 from the semiconductor substrate 102. In some embodiments, a process for forming the pad stack 302 comprises depositing the lower pad layer 304 on the semiconductor substrate 102, and further depositing the upper pad layer 306 on the lower pad layer 304. The lower pad layer 304 and the upper pad layer 306 may be deposited by, for example, chemical vapor deposition (CVD), physical vapor deposition (PVD), thermal oxidation, or some other suitable deposition process. The lower pad layer 304 is a different material than the upper pad layer 306 and may comprise, for example, an oxide or some other suitable dielectric. The upper pad layer 306 may comprise, for example, a nitride or some other suitable dielectric.

Figure 4A:
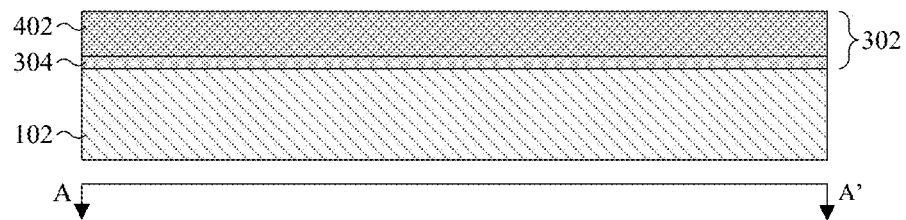
Figure 4B:
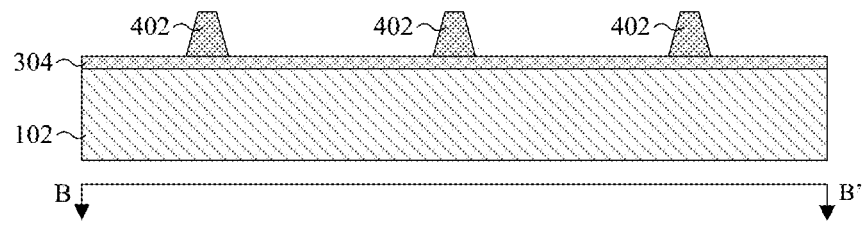

As shown in FIGS. 4A-4B, the upper pad layer 306 is patterned and etched into a patterned upper pad layer 402. The patterned upper pad layer 402 may leave exposed portions of the semiconductor substrate 102 that are to be formed into isolation structures. In some embodiments, a process for patterning and etching the upper pad layer 306 may be performed by, for example, a photolithography/etching process or some other suitable patterning/etching process.

With regard to forming a pair of memory cells comprising floating gates that have a shape configured to improve device performance, the photolithography/etching process may comprise, for example, depositing a photoresist layer on a substrate, and subsequently patterning the photoresist layer with a pattern. The depositing may, for example, be performed by spin on coating or some other suitable deposition process. The patterning may be performed by, for example, photolithography or some other suitable patterning process. Further, the photolithography/etching process may comprise, for example, performing an etch into the substrate with the patterned photoresist in place to transfer the pattern to the substrate, and subsequently removing the patterned photoresist layer. The removal may, for example, be performed by plasma ashing or some other suitable removal process.

Figure 5A:
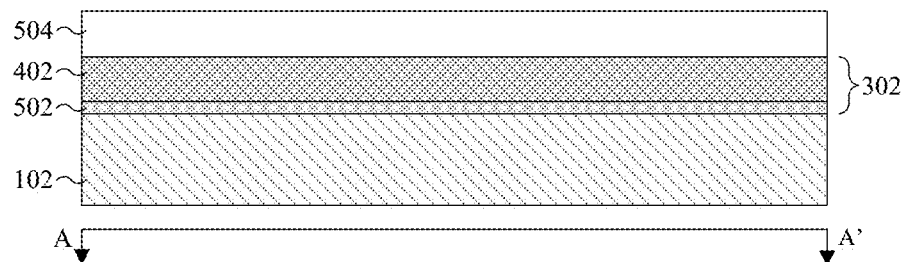

As shown in FIGS. 5A-59, portions of the lower pad layer 304 not covered by the patterned upper pad layer 402 are removed to form a patterned lower pad layer 502, and portions of the semiconductor substrate not covered by the patterned upper pad layer 402 are partially removed to form a plurality of trenches (not shown) in the semiconductor substrate 102. Subsequently, a dielectric layer 504 is formed over/within the semiconductor substrate 102, such that the dielectric layer 504 covers the patterned upper pad layer 402 and fills the trenches in the semiconductor substrate 102.

In some embodiments, a process for forming the dielectric layer 504 over/within the semiconductor substrate 102 comprises performing a first etch that etches through the lower pad layer 304 to form the patterned lower pad layer 502 and to partially remove regions of the semiconductor substrate to form trenches (not shown) in the semiconductor substrate 102. In other embodiments, multiple etching steps are performed to form the patterned lower pad layer 502 and the trenches (not shown) in the semiconductor substrate 102. Subsequently, the dielectric layer 504 may be deposited over/within the semiconductor substrate 102 by, for example, CVD, PVD, thermal oxidation, some other suitable deposition process, or a combination of the foregoing. In yet other embodiments, the dielectric layer 504 is deposited by a different process than the lower pad layer 304 and/or is a different material than the lower pad layer 304.

Figure 6A:
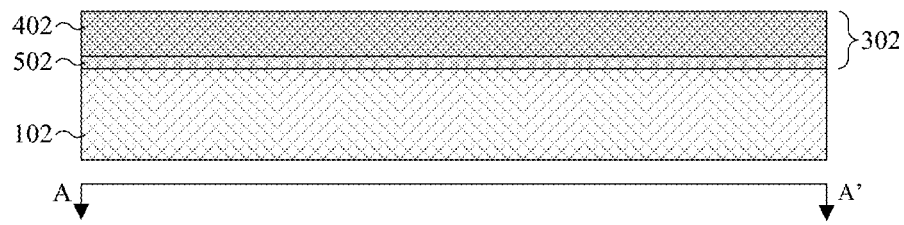
Figure 6B:
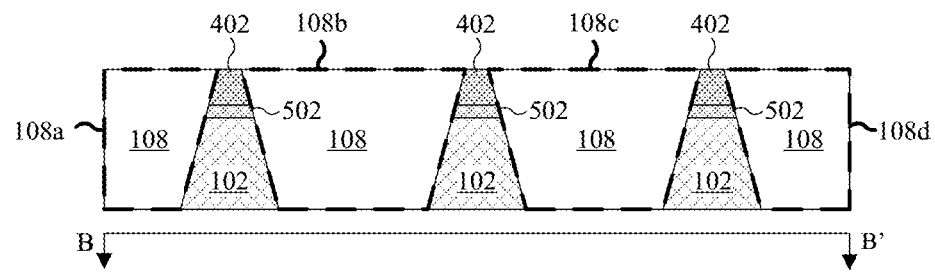

As shown in FIGS. 6A-6B, the dielectric layer 504 and the patterned upper pad layer 402 are planarized, such that an isolation structure 108 having isolation segments 108a-108d is formed in the semiconductor substrate 102. In some embodiments, upper surfaces of the isolation segments 108a-108d are co-planar with upper surfaces of the patterned upper pad layer 402. In further embodiments, a process for planarizing the dielectric layer 504 and the patterned upper pad layer 402 may comprise, for example, performing a chemical-mechanical planarization (CMP) process into the dielectric layer 504 until the patterned upper pad layer 402 is exposed to the CMP process.

Figure 7A:
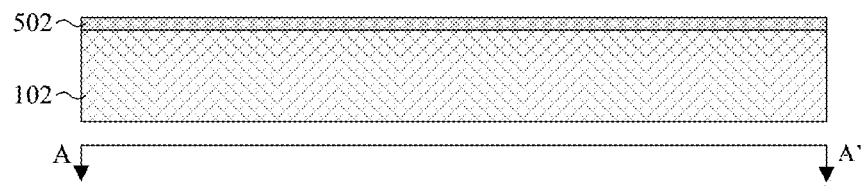
Figure 7B:
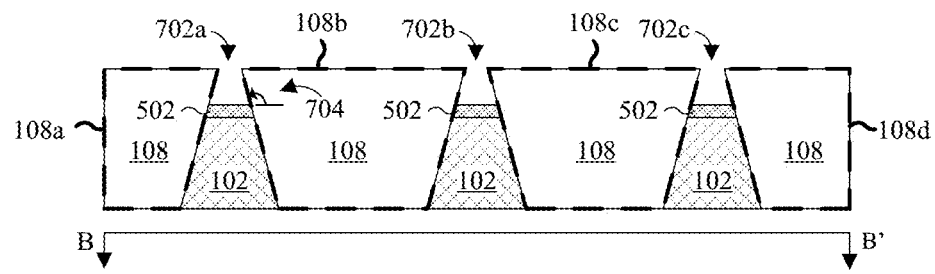

As shown in FIGS. 7A-7B, the patterned upper pad layer 402 is removed to form openings 702a-702c respectively arranged between isolation segments 108a-108d. In some embodiments, opposing sidewalk of the openings 702a-702c respectively extend from the patterned lower pad layer 502 at first acute angles, such that a first supplementary angle 704 of an isolation segment (e.g., 108b) is a first obtuse angle. In further embodiments, the first acute angles are substantially similar. In yet further embodiments, a process for removing the patterned upper pad layer 402 may comprise, for example, performing an etching process or some other suitable removal process. The etching process may comprise, for example, a wet etchant comprising diluted hydrofluoric (IMW) acid or some other suitable etchant(s).

Figure 8A:
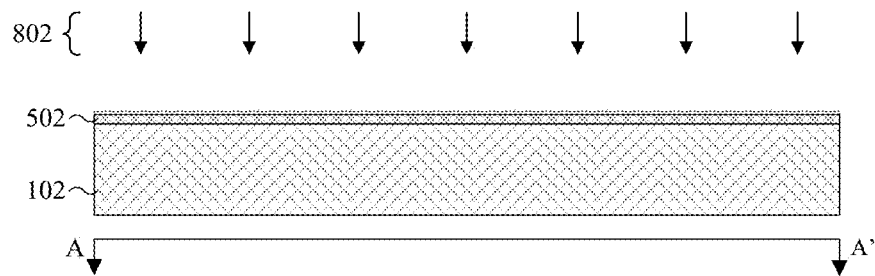
Figure 8B:
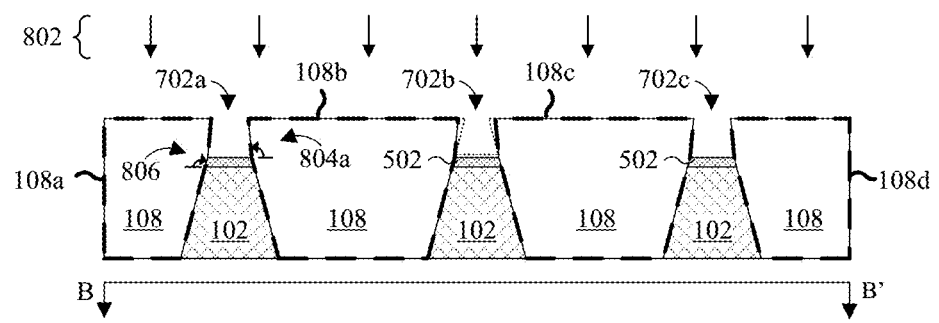

As shown in FIGS. 8A-8B, a second etch 802 is performed on the semiconductor substrate 102 to increase a width and height of the openings 702a-702c. The second etch 802 partially removes portions of the patterned lower pad layer 502 to increase a height of the openings 702a-702c. The second etch 802 removes portions of the isolation segments 108a-108d to increase the width of the openings 702a-702c. In some embodiments, the width of the openings 702a-702c is increased more than a height of the openings 702a-702c. Further, the second etch 802 increase the width of the openings 702a-702c near a top of the openings 702a-702c more than the second etch 802 increases a width of the openings 702a-702c near a bottom surface of the openings. In some embodiments, the width near a top of the openings 702a-702c is increased twice as much as the width near a bottom of the openings 702a-702c.

Moreover, the second etch 802 increases the first acute angles at which the opposing sidewalls of the openings 702a-702c respectively extend from the patterned lower pad layer 502 to second acute angles that are greater than the first acute angles, such that a second supplementary angle 804a of an isolation segment (e.g., 108b) is a second obtuse angle less than the first obtuse angle. In some embodiments, sidewalls of the patterned lower pad layer 502 extend from bottom surfaces of the patterned lower pad layer 502 to top surfaces of the patterned lower pad layer at the first acute angle, such that a third supplementary angle 806 of an isolation segment (e.g., 108a) is substantially similar to the first obtuse angle. In embodiments, the second acute angles are substantially similar.

In some embodiments, the second etch 802 is a chemical oxide removal (COR) etch. The COR etch is a plasmaless gaseous etching process that comprises a first chemical treatment process and a second chemical treatment process. The first chemical treatment process may comprise exposing the semiconductor substrate 102 to ammonium ($NH_3$) and/or hydrogen fluoride (HF) in a first processing chamber to cause the $NH_3$ and or HF to adsorb onto the semiconductor substrate 102 and produce a by-product on surfaces of the isolation segments 108a-108d, and/or the patterned lower pad layer 502. The second chemical treatment process may comprise heating the semiconductor substrate 102 in a nitrogen gas (N2) environment to evaporate the by-product on the surface of the semiconductor substrate 102, such that evaporating the by-product etches portions of the isolation segments 108a-108d and portions of the patterned lower pad layer 502. In some embodiments, the first processing chamber is configured to maintain a temperature of the semiconductor substrate 102 between about 20° C. and about 85° C. In some embodiments, the second processing chamber is configured to heat the semiconductor wafer to a temperature between about 100° C. and 200° C. In further embodiments, the COR etch is a self-limiting etch. In yet further embodiments, the COR etch is performed in a Certas™ etching system.

Figure 8C:
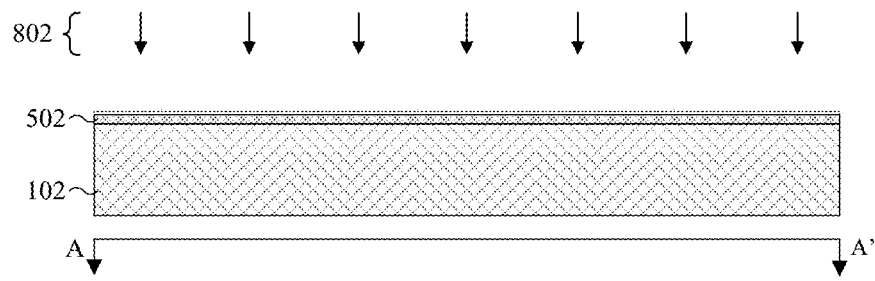
Figure 8D:
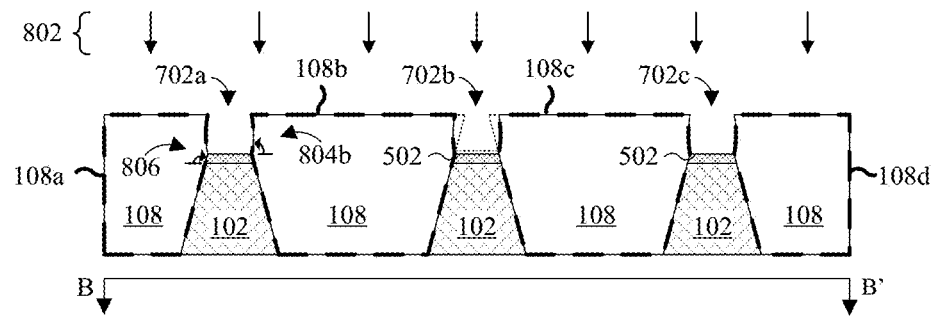

FIGS. 8C-8D illustrate various other embodiments of a profile of the openings 702a-702c after the second etch is performed. As shown by FIGS. 8C-8D, the second etch 802 may round the opposing sidewalk; of the openings 702a-702c, such that the opposing sidewalk; respectively arch from a bottom surface of the openings 702a-702c to a top of the openings 702a-702c. In such an embodiment, the second etch 802 may increase the width of the openings 702a-702c near a midpoint of the openings 702a-702c more than the second etch 802 increases a width of the openings 702a-702c near a bottom surface of the openings. The width near a midpoint of the openings 702a-702c may be increased twice as much as the width near a bottom of the openings 702a-702c. Further, the second etch 802 may increase the first acute angles at which the opposing sidewalk of the openings 702a-702c respectively extend from the patterned lower pad layer 502 to intermediate obtuse angles, such that a fourth supplementary angle 804b of an isolation segment (e.g., 108b) is an acute angle. In addition, the intermediate obtuse angles may be substantially similar.

Figure 9A:
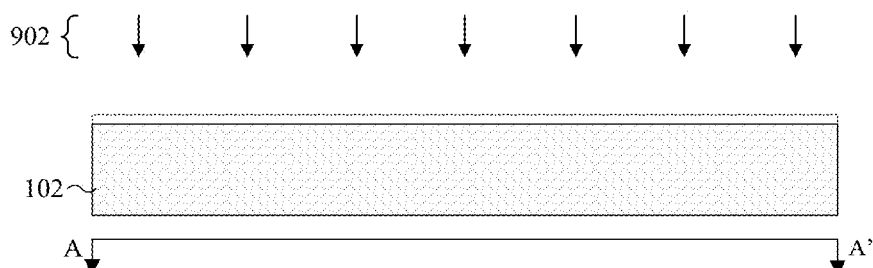
Figure 9B:
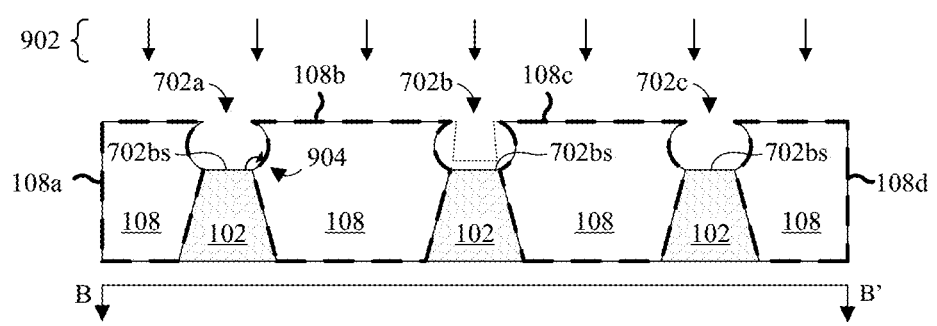

As shown in FIGS. 9A-9B, a third etch 902 is performed on the semiconductor substrate 102 to further increase a width and height of the openings 702a-702c. The third etch 902 removes the patterned lower pad layer 502 to further increase a height of the openings 702a-702c. The third etch 902 removes portions of the isolation segments 108a-108d to further increase the width of the opening. Further, the third etch 902 rounds the sidewalls of the openings 702a-702c, such that a sidewall of an opening (e.g., 702a) arches at an obtuse angle 904 from a bottom surface of the opening to a top surface of an isolation segment (e.g., 108b). In some embodiments, sidewalls of the openings 702a-702c extend from bottom surfaces of the openings 702a-702c at substantially similar obtuse angles to top surfaces of the isolation segments 108a-108d, respectively. In some embodiments, the third etch 902 is an isotropic wet etch. The isotropic wet etch may comprise, for example, a wet etchant comprising diluted hydrofluoric acid (DHF) or some other suitable etchant(s).

The third etch 902 expands the openings 702a-702c to a critical width that promotes high erase speeds. Further, because the second etch 802 preferentially increases the width of the openings 702a-702c relative to the height of the openings 702a-702c, the third etch 902 does not need to persist so long that the third etch 902 forms divots. Accordingly, the openings 702a-702c are formed with substantially planar bottom surfaces 702bs. With regards to the bottom surfaces 702bs, substantially planar is defined as having a variation between an uppermost point of a first bottom surface 702bs of a first opening (e.g., 702a) and a lowermost point of the first bottom surface 702bs of the first opening (e.g., 702a) that is less than about ten angstroms.

Therefore, by implementing a second etch 802 that preferentially increases the width of the openings 702a-702c relative to the height of the openings 702a-702c before implementing a third etch 902 to expand the openings 702a-702c to a critical width that promotes high erase speeds, divot formation in the isolation structure 108 is reduced. More specifically, by implementing a COR etch that preferentially increases the width of the openings 702a-702c relative to the height of the openings 702a-702c before implementing a wet etch to expand the openings 702a-702c to a critical width that promotes high erase speeds, divot formation in the isolation structure 108 is reduced. Accordingly, the negative effects on electrical behavior of memory cells 104 (and/or other adjacent devices) caused by divots forming in the isolation segments 108a-108d and subsequently causing floating gates 208 to have bottom surfaces with sharp edges may be reduced, while increasing the critical width of the floating gates 208.

Figure 10A:
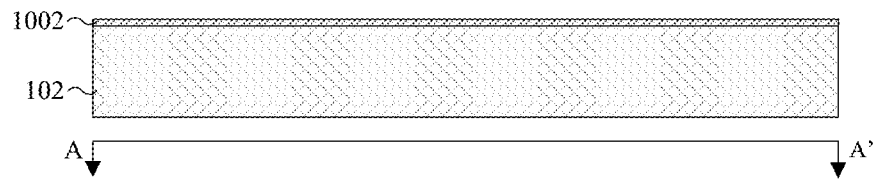
Figure 10B:
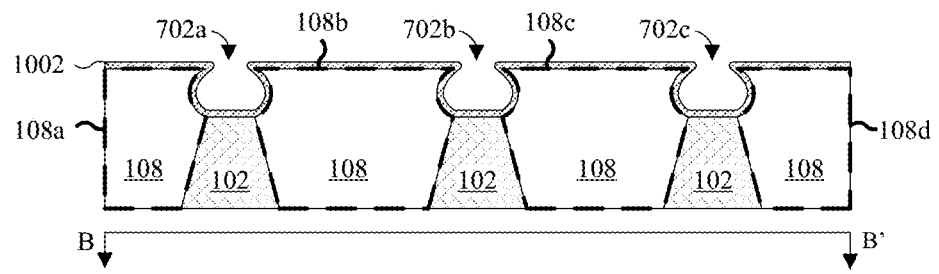

As shown in FIGS. 10A-10B, a conformal dielectric layer 1002 is formed over the isolation segments 108a-108d and in the openings 702a-702c. Because the openings 702a-702c have substantially planar bottom surfaces 702bs, the conformal dielectric layer has substantially planar bottom surfaces and top surfaces in the openings 702a-702c. The conformal dielectric layer 1002 may comprise, for example, an oxide, some other suitable dielectric, or a combination of the forgoing. In some embodiments, a process for forming the conformal dielectric layer 1002 comprises depositing the conformal dielectric layer 1002 by, for example, CVD, PVD, or some other suitable deposition process.

Figure 11A:
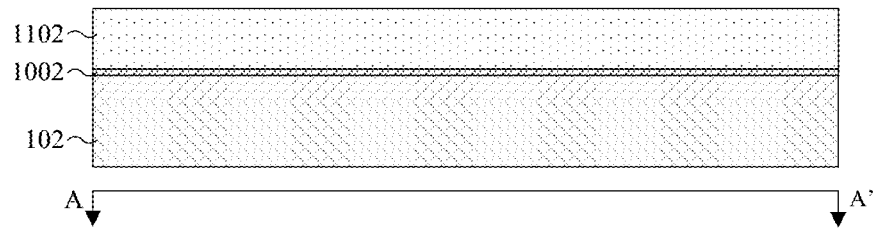
Figure 11B:
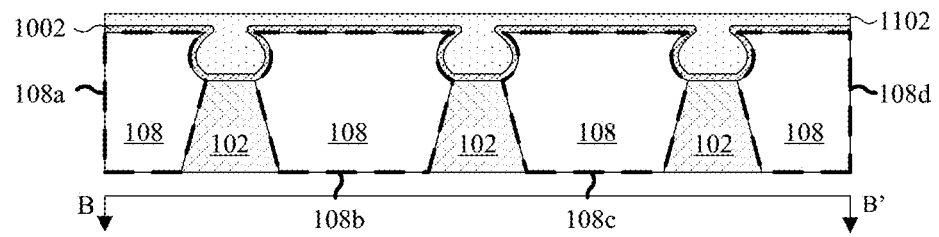

As shown in FIGS. 11A-11B, a floating gate layer 1102 is formed over the conformal dielectric layer 1002, such that the floating gate layer 1102 fills the openings 702a-702c. The floating gate layer 1102 may comprise, for example, a metal, doped polysilicon, or some other suitable conductor(s). In some embodiments, a process for forming the floating gate layer 1102 may comprise depositing the floating gate layer 1102 by, for example, CVD, PVD, electroless plating, electroplating, or some other suitable deposition or plating process.

Figure 12A:
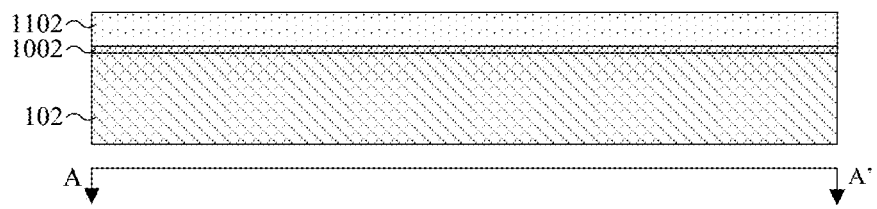
Figure 12B:
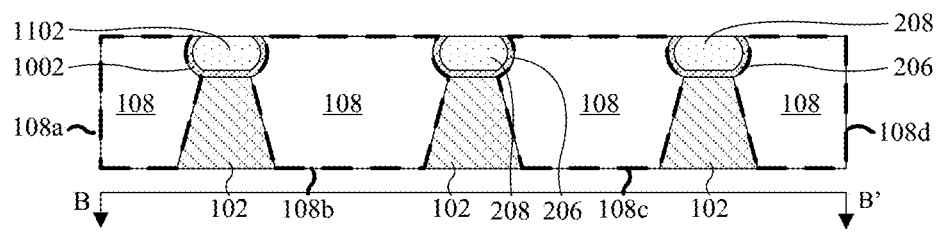

As shown in FIGS. 12A-12B, the floating gate layer 1102 and the conformal dielectric layer 1002 are planarized. In some embodiments, a process for planarizing the floating gate layer 1102 and the conformal dielectric layer 1002 may comprise, for example, performing a CMP process into the floating gate layer 1102 and the conformal dielectric layer 1002 until upper surfaces of the floating gate layer 1102, the conformal dielectric layer 1002, and the isolation segments 108a-108d are co-planar.

Figure 13A:
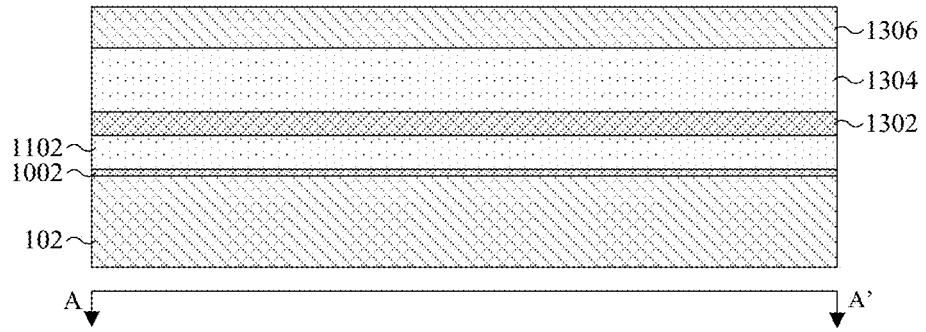
Figure 13B:
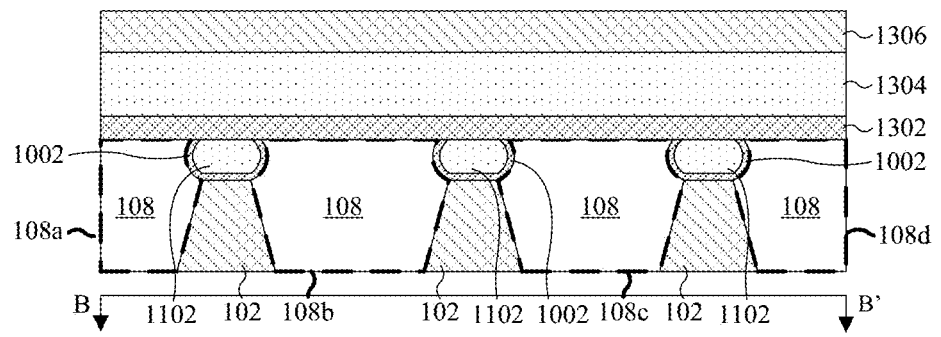

As shown in FIGS. 13A-13B, a first dielectric layer 1302, a control gate layer 1304, and a control gate hard mask layer 1306 are stacked on the floating gate layer 1102, the conformal dielectric layer 1002, and the isolation structure 108. The control gate layer 1304 is formed over the first dielectric layer 1302, and the control gate hard mask layer 1306 is formed over the control gate layer 1304. The control gate layer 1304 may comprise, for example, a metal, doped polysilicon, or some other suitable conductor. In some embodiments, the control gate layer 1304 may be formed by, for example, CVD, PVD, electroless plating, electroplating, or some other suitable deposition or plating process. The first dielectric layer 1302 and the control gate hard mask layer 1306 may comprise, for example, an oxide, a nitride, or some other suitable dielectric, or a combination of the foregoing. In some embodiments, the first dielectric layer 1302 and the control gate hard mask layer 1306 may comprise a first oxide layer separated from a second oxide layer by a nitride layer. In further embodiments, the first dielectric layer 1302 and the control gate hard mask layer 1306 may be formed by, for example, CVD, PVD, or some other suitable deposition process.

As shown by FIG. 14A-14B, the first dielectric layer 1302, the control gate layer 1304, and the control gate hard mask layer 1306 are patterned and etched into control gate dielectric layers 210, control gates 212, and control gate hard masks 214, respectively. In some embodiments, a process for patterning and etching the first dielectric layer 1302, the control gate layer 1304, and the control gate hard mask layer 1306 are patterned and etched may be performed by, for example, a photolithography/etching processes) or some other suitable patterning/etching process.

As shown in FIGS. 15A-15B, a control gate spacer layer 1502 is formed over the floating gate layer 1102, along sidewalls of the control gate dielectric layers 210, along sidewalls of the control gates 212, and along sidewalls of the control gate hard masks 214. In some embodiments, the control gate spacer layer 1502 may comprise, an oxide, a nitride, some other dielectric, or a combination of the foregoing. In further embodiments, the control gate spacer layer 1502 may comprise a first oxide layer separated from a second oxide layer by a nitride layer. In further embodiments, the control gate spacer layer 1502 may be formed by, for example, CVD, PVD, or some other suitable deposition process.

As shown in FIGS. 16A-16B, the control gate spacer layer 1502 is etched to form a pair of control gate spacers 216 respectively over the floating gate layer 1102. The control gate spacers 216 comprise multiple segments respectively on sidewalls of the control gate dielectric layers 210, sidewalls of the control gates 212, and sidewalls of the control gate hard masks 214. The control gate spacers 216 may comprise, an oxide, a nitride, some other dielectric, or a combination of the foregoing. In further embodiments, the control gate spacers 216 may comprise a first oxide layer separated from a second oxide layer by a nitride layer. In yet further embodiments, a process for forming the control gate spacers 216 comprises an etch back process that removes horizontal segments of the control gate spacer layer 1502 without removing vertical segments of the control gate spacer layer 1502, and the remaining vertical segments corresponding to the control gate spacers 216.

As shown in FIGS. 17A-17B, the floating gate layer 1102 and the conformal dielectric layer 1002 are patterned and etched into floating gates 208 and floating gate dielectric layers 206, respectively. The floating gates 208 are respectively separated from the plurality of isolation segments 108a-108d and the semiconductor substrate 102 by the floating gate dielectric layers 206. In some embodiments, a process for patterning and etching the floating gate layer 1102 and the conformal dielectric layer 1002 may be performed by, for example, a photolithography/etching process or some other suitable patterning/etching process.

Figure 18A:
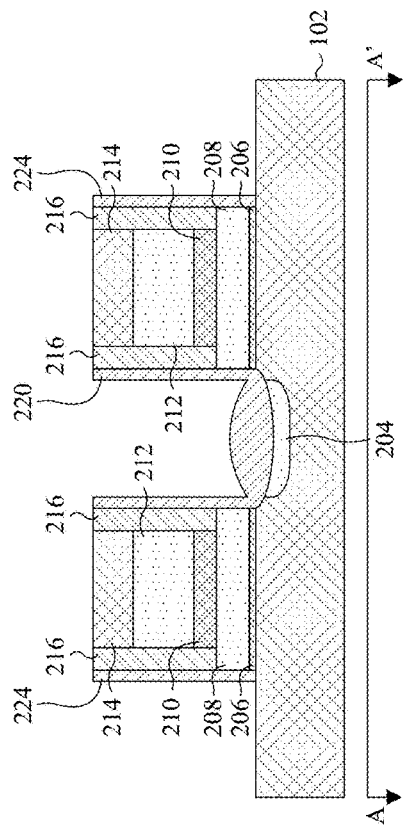
Figure 18B:
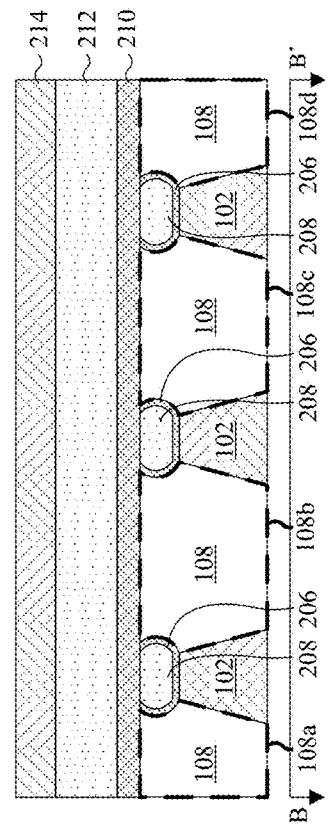

As shown in FIGS. 18A-18B, floating gate spacers 224 are formed. The floating gate spacers 224 comprise multiple segments respectively on sidewalls of the control gate spacers 216, sidewalls of the floating gates 208, and sidewalls of the floating gate dielectric layers 206. The floating gate spacers 224 may comprise, for example, an oxide, a nitride, an oxynitride, some other suitable dielectric, or a combination of the foregoing.

In some embodiments, a process for forming the floating gate spacers 224 comprises depositing a spacer layer covering and lining the structure of FIGS. 17A and 17B, and subsequently performing an etch back into the spacer layer. The depositing may be performed by, for example, CVD, PVD, or some other suitable deposition process. In further embodiments, the spacer layer is deposited as a conformal layer. The etch back removes horizontal segments of the spacer layer, without removing the vertical segments of the spacer layer, and the remaining vertical segments correspond to the floating gate spacers 224.

Also shown in FIGS. 18A-18B, a common source/drain region 204 is formed in the semiconductor substrate 102 and between the floating gates 208. The common source/drain region 204 is a doped region of the semiconductor substrate 102 and may have, for example, an opposite doping type than that of an adjoining region of the semiconductor substrate 102. In some embodiments, a process for forming the common source/drain region 204 comprises forming a photoresist layer covering the structure of FIGS. 17A and 17B. The photoresist layer is patterned to define an opening exposing the substrate between the floating gates 208 using a photolithography process. A doping process is then performed with the patterned photoresist in place to form the common source/drain region 204 through the opening. The doping process may comprise, for example, ion implantation or some other suitable doping process. Subsequently, the photoresist layer is removed.

Figure 19A:
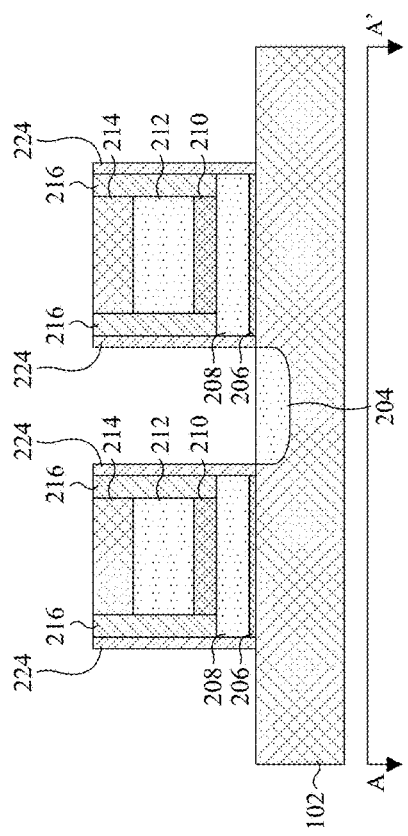
Figure 19B:
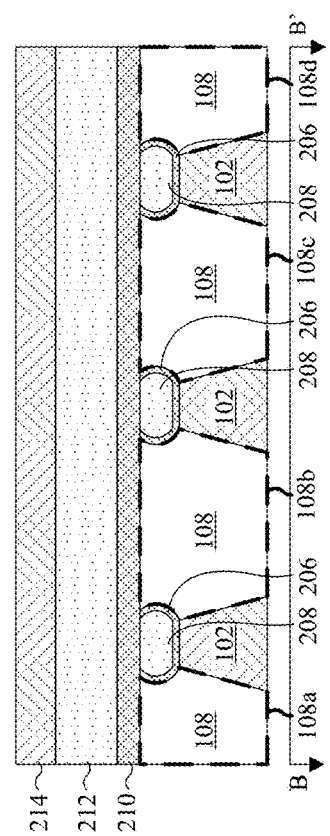

As shown in FIGS. 19A-19B, an erase gate dielectric layer 220 is formed covering the common source/drain region 204 and lining sidewalls facing the common source/drain region 204 of the floating gate dielectric layers 206, the floating gates 208, and the control gate spacers 216. The erase gate dielectric layer 220 may comprise, for example, an oxide, a nitride, or some other suitable dielectric.

In some embodiments, a process for forming the erase gate dielectric layer 220 comprises removing the floating gate spacers 224 that border the common source/drain region 204. A dielectric layer is then deposited covering the structure of FIGS. 19A and 19B (without the floating gate spacers 224 that border the common source/drain region 204 in place). The dielectric layer may be deposited, for example, by thermal oxidation, CVD, PVD, some other suitable deposition process, or a combination of the foregoing. The dielectric layer is then patterned and etched into the erase gate dielectric layer 220. The patterning and etching may be performed by, for example, a photolithography/etching process or some other suitable patterning/etching process.

As shown by FIGS. 20A-20B, a second dielectric; layer 2002 is formed on the semiconductor substrate 102 and to the sides of the floating gate spacers 224. The second dielectric layer 2002 may comprise an oxide, a nitride, or some other suitable dielectric. In some embodiments, the second dielectric layer 2002 may be formed by, thermal oxidation, CVD, PVD, or some other suitable deposition process.

Also shown in FIGS. 20A-20B, a gate layer 2004 is formed covering the structure of FIGS. 19A-19B (with the second dielectric layer 2002 in place). The gate layer 2004 may comprise, for example, a metal, doped polysilicon, or some other suitable conductor. In some embodiments, the gate layer 2004 may be formed by, for example, CVD, PVD, electroless plating, electroplating, or some other suitable deposition or plating process.

As shown in FIGS. 21A-21B, the second dielectric layer 2002 and the gate layer 2004 are patterned and etched to form select gates 222 and select gate dielectric layers 226, respectively. Further, the patterning and etching of the gate layer 2004 forms the erase gate 218. The select gates 222 respectively overlie the select gate dielectric layers 226 and border sidewalls of the floating gate spacers 224. The erase gate 218 overlies the common source/drain region 204 and is separated from the common source/drain region 204 by the erase gate dielectric layer 220.

In some embodiments, a process for patterning and etching the select gate dielectric layers 226 and the gate layer 2004 comprises performing a first etch into the gate layer 2004 to etch back the gate layer 2004, and to remove horizontal segments of the gate layer 2004 without removing vertical segments of the gate layer 2004. The remaining vertical segments correspond to the select gates 222 and the erase gate 218. Further, a second etch is performed into the second dielectric layer 2002 with the memory select gates 222 in place to form the select gate dielectric layers 226. The second etch may stop, for example, on the semiconductor substrate 102, and/or the select gates 222 may serve as a mask for the second etch.

Figure 22A:
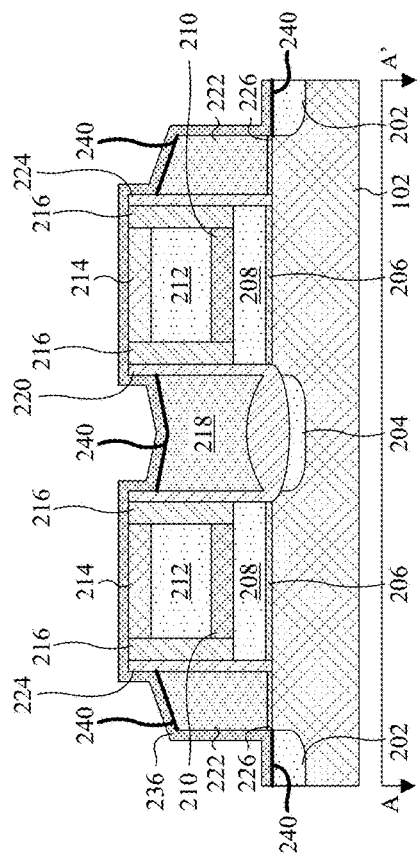
Figure 22B:
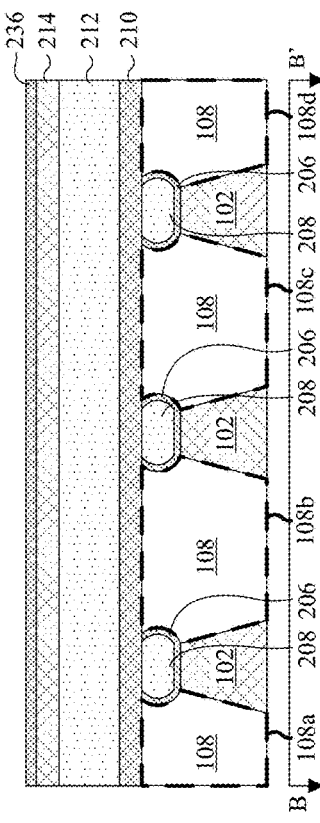

As shown in FIGS. 22A-22B, individual source/drain regions 202 are formed in the semiconductor substrate 102. The individual source/drain regions 202 respectively border the select gates 222 and are respectively spaced from the common source/drain region 204 by the floating gates 208. Further, the individual source/drain regions 202 may have the same doping type as the common source/drain region 204. In some embodiments, the individual source/drain regions may be formed by, for example, ion implantation or some other suitable doping process.

Figure 23A:
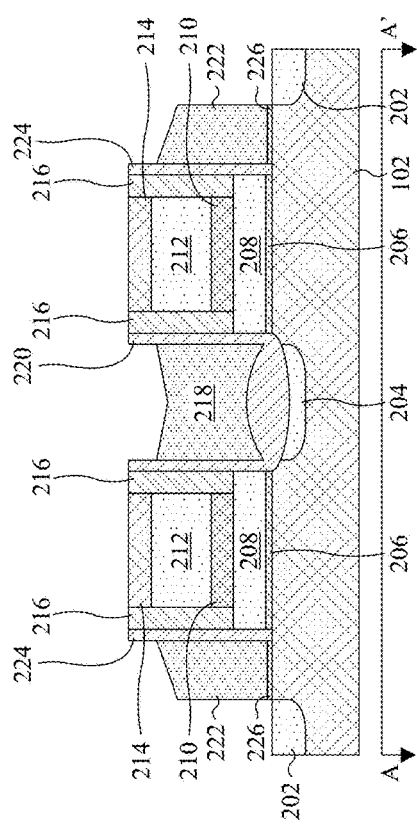
Figure 23B:
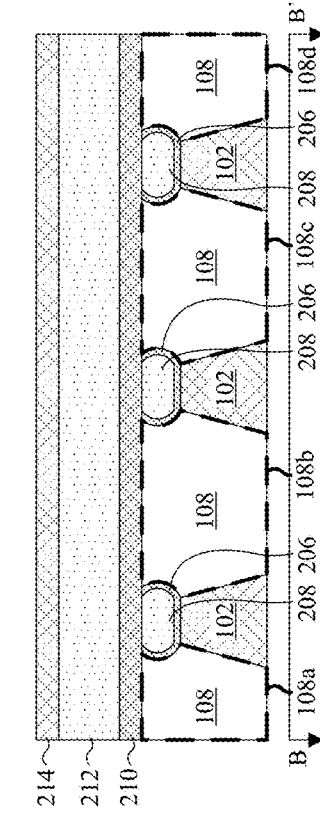

As shown in FIGS. 23A-23B, silicide pads 240 are formed on top surfaces of the individual source/drain regions 202, the select gates 222, and the erase gate 218. The silicide pads 240 may comprise, for example, nickel silicide, titanium silicide, cobalt silicide, tungsten silicide, or some other suitable silicide. In some embodiments, the silicide pads 240 may be formed by, for example, a silicide process of some other suitable silicide process.

Also shown in FIGS. 23A-23B, a contact etch stop layer (CESL) 236 is formed in some embodiments covering the structure of FIGS. 22A and 22B (with the silicide pads 240 in place). The CESL 236 may comprise, for example, a nitride, an oxynitride, a carbide, some other suitable dielectric, or a combination of the foregoing. In some embodiments, the CESL 236 may be formed by, for example, CVD, PVD, or some other suitable deposition process. In further embodiments, CESL 236 is deposited as a conformal layer.

Figure 24A:
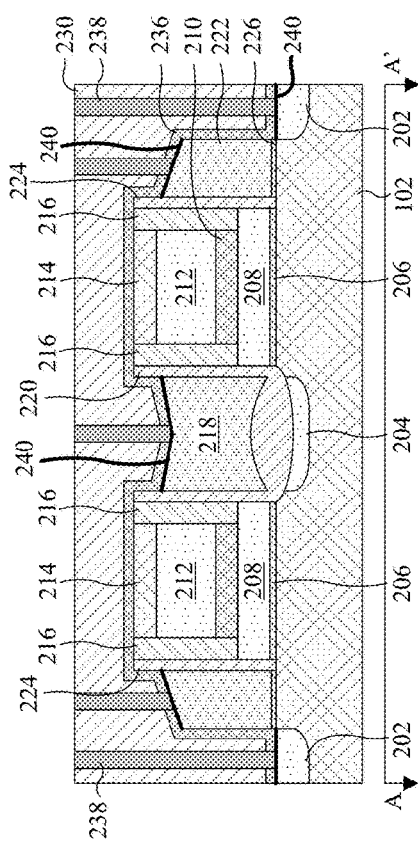
Figure 24B:
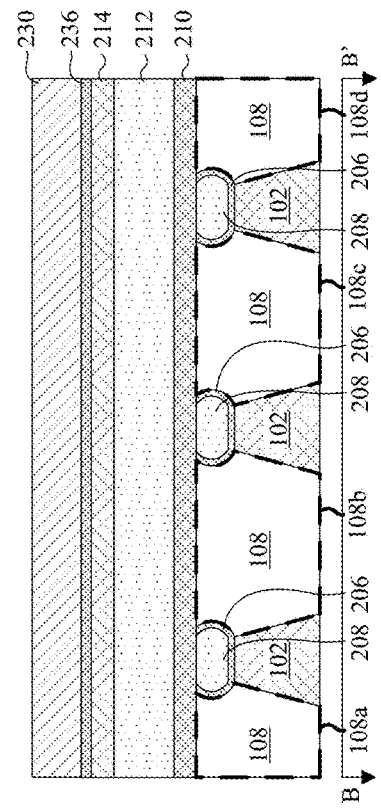

As shown in FIGS. 24A-24B, an interlayer dielectric (ILD) layer 230 is formed covering the CESL 236. In some embodiments, the ILD layer 230 is formed with a substantially planar top surface. The ILD layer 230 may comprise, for example, an oxide, a low κ dielectric, or some other suitable dielectric. In further embodiments, a process for forming the ILD layer 230 comprises depositing the ILD layer 230, and subsequently planarizing the top surface of the ILD layer 230. The ILD layer 230 may be deposited by, for example, CVD, PVD, or some other suitable deposition process. The ILD layer 230 may be planarized by, for example, a CMP process or some other suitable planarization process.

Figure 25A:
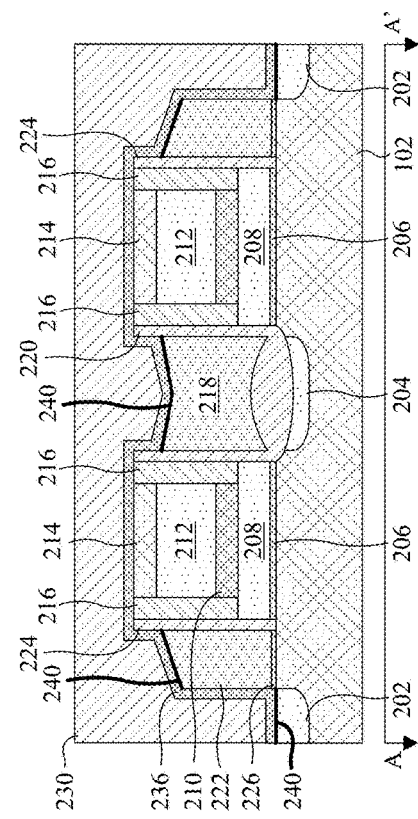
Figure 25B:
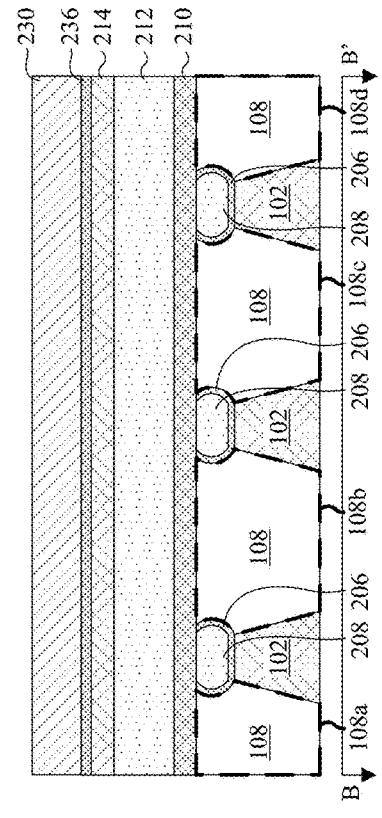

As shown in FIGS. 25A-25B, conductive vias 238 are formed extending from a top surface of the ILD layer 230 through the ILD layer 230 to the individual source/drain regions 202, select gates 222, and the erase gate 218. For ease of illustration only some of the conductive vias 238 are labeled. The conductive vias 238 may comprise, for example, tungsten, aluminum, copper, some other suitable conductor.

In some embodiments, a process for forming the conductive vias 238 comprises forming a photoresist layer covering the ILD layer 230. The photoresist layer is patterned with a layout of the conductive vias 238, and an etch is performed into the ILD layer 230 with the patterned photoresist layer in place to form contact openings corresponding to the conductive vias 238. The patterning may, for example, be performed by photolithography or some other suitable patterning process. A conductive layer is then deposited covering the ILD layer 230 and filling the contact openings. A planarization process is performed into the conductive layer until the ILD layer 230 is reached. The conductive layer may be deposited by, for example, CVD, PVD, electroless plating, electroplating, or some other suitable deposition or plating process. The planarization process may be, for example, a CMP process or some other suitable planarization process.

Figure 26A:
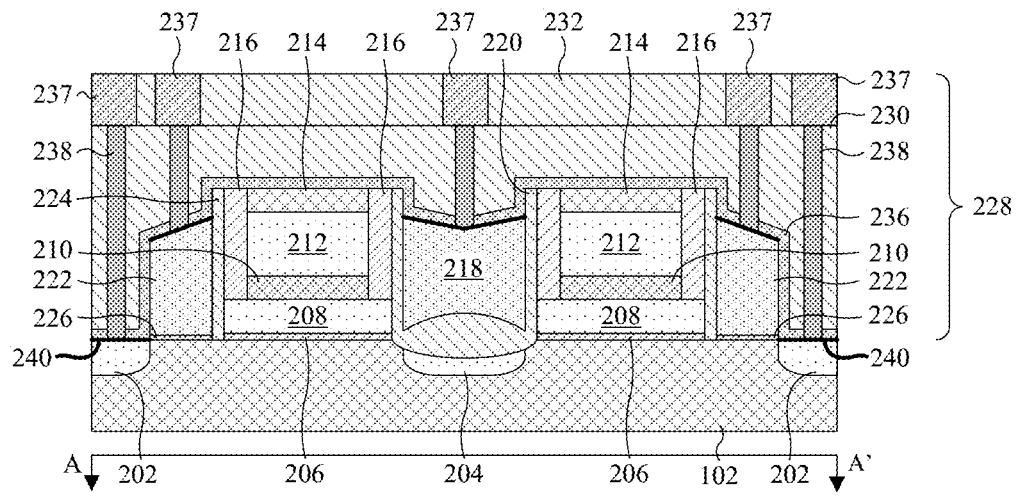
Figure 26B:
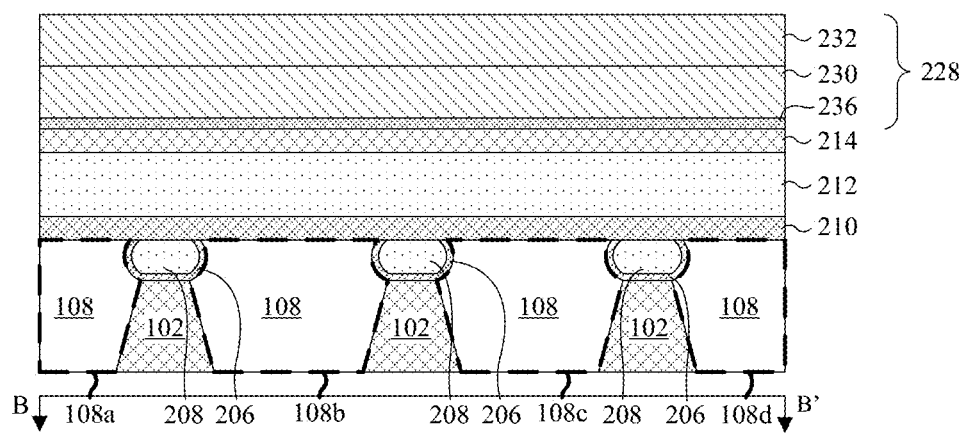

As shown in FIGS. 26A-26B, conductive lines 237 are formed over and in contact with the conductive vias 238. The conductive lines 237 may comprise, for example, copper, aluminum, or some other suitable conductor. In some embodiments, a process for forming the conductive lines 237 comprises depositing an intermetal dielectric (IMD) layer 232 covering the ILD layer 230 and the conductive vias 238. The IMD layer 232 may be deposited by, for example, CVD, PVD, or some other suitable deposition process. The IMD layer 232 is then planarized. The IMD layer 232 is then patterned and etched to from a plurality of openings with a layout of the conductive lines 237. The patterning and etching may be performed by a photolithography/etching process or some other suitable patterning/etching process. A conductive layer is formed covering the IMD layer 232 and filling the openings, and another planarization process is performed into the conductive layer to form the conductive lines 237 in the openings. The conductive layer may be deposited by, for example, CVD, PVD, electroless plating, electroplating, or some other suitable deposition or plating process. The planarizations of the IMD layer 232 and the conductive layer may, for example, be performed by a CMP process or some other suitable planarization process. In further embodiments, the CESL 236, the ILD layer 230, the IMD layer 232, the conductive vias 238, and the conductive lines 237 define an interconnect structure 228.

Figure 27:
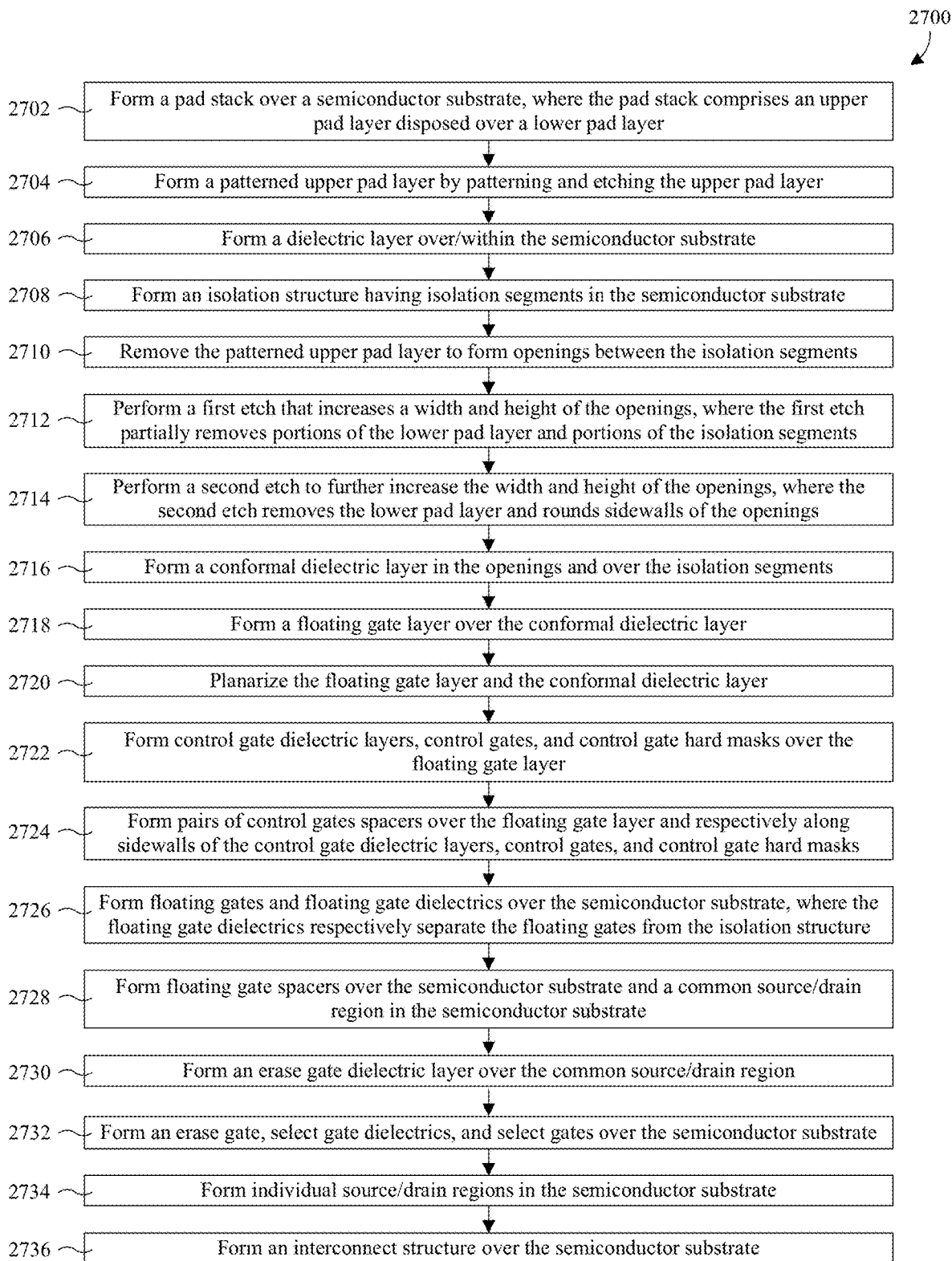
FIG. 27 illustrates a flowchart of some embodiments of the method of FIGS. 3A and 3B through 26A and 26B.

As illustrated in FIG. 27, a flowchart 2700 of some embodiments of the method of FIGS. 3A and 3B through 26A and 26B is provided. While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At 2702, a pad stack is formed over a semiconductor substrate, where the pad stack comprises an upper pad layer disposed over a lower pad layer. FIGS. 3A-3B illustrate cross-sectional views of some embodiments corresponding to act 2702.

At 2704, a patterned upper pad layer is formed by patterning and etching the upper pad layer. FIGS. 4A-4B illustrate cross-sectional views of some embodiments corresponding to act 2704.

Figure 5B:
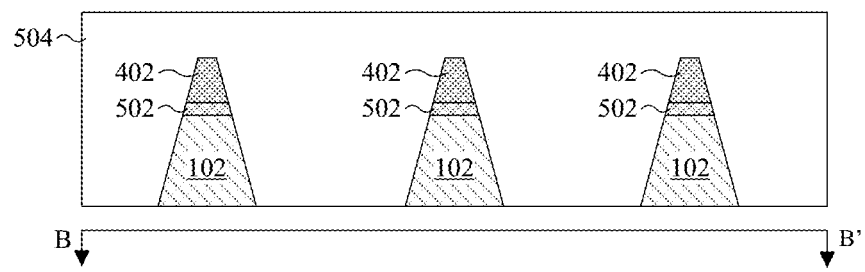

At 2706, a dielectric layer is formed over/within the semiconductor substrate. FIGS. 5A-5B illustrate cross-sectional views of some embodiments corresponding to act 2706.

At 2708, an isolation structure having isolation segments is formed in the semiconductor substrate. FIGS. 6A-6B illustrate cross-sectional views of some embodiments corresponding to act 2708.

At 2710, the patterned upper pad layer is removed to form openings between the isolation segments. FIGS. 7A-7B illustrate cross-sectional views of some embodiments corresponding to act 2710.

At 2712, a first etch is performed that increases a width and a height of the openings, where the first etch partially removes portions of the lower pad layer and portions of the isolation segments. FIGS. 8A-8B illustrate cross-sectional views of some embodiments corresponding to act 2712.

At 2714, a second etch is performed that further increases the width and height of the openings, where the second etch removes the lower pad layer and rounds sidewalls of the openings. Accordingly, the negative effects on electrical behavior of memory cells (and/or other adjacent devices) caused by divots forming in the isolation segments and subsequently causing floating gates to have bottom surfaces with sharp edges may be reduced, while increasing the critical width of the floating gates. FIGS. 9A-9B illustrate cross-sectional views of some embodiments corresponding to act 2714.

At 2716, a conformal dielectric layer is formed in the openings and over the isolation segments. FIGS. 10A-10B illustrate cross-sectional views of some embodiments corresponding to act 2716.

At 2718, a floating gate layer is formed over the conformal dielectric layer. FIGS. 11A-11B illustrate cross-sectional views of some embodiments corresponding to act 2718.

At 2720, the floating gate layer and the conformal dielectric layer are planarized. FIGS. 12A-12B illustrate cross-sectional views of some embodiments corresponding to act 2720.

At 2722, control gate dielectric layers, control gates, and control gate hard masks are formed over the floating gate layer. FIGS. 13A and 13B through FIGS. 14A and 14B illustrate cross-sectional views of some embodiments corresponding to act 2722.

At 2724, pairs of control gate layers are formed over the floating gate layer and respectively along sidewalls of the control gate dielectric layers, control gates, and control gate hard masks. FIGS. 15A and 15B through FIGS. 16A and 16B illustrate cross-sectional views of some embodiments corresponding to act 2724.

At 2726, floating gates and floating dielectrics are formed over the semiconductor substrate, where the floating gate dielectrics respectively separate the floating gates from the isolation structure. FIGS. 17A-17B illustrate cross-sectional views of some embodiments corresponding to act 2726.

At 2728, floating gate spacers are formed over the semiconductor substrate, and a common source/drain region is formed in the semiconductor substrate. FIGS. 18A-18B illustrate cross-sectional views of some embodiments corresponding to act 2728.

At 2730, an erase gate dielectric layer is formed over the common source/drain region. FIGS. 19A-19B illustrate cross-sectional views of some embodiments corresponding to act 2730.

At 2732, an erase gate, select gate dielectrics, and select gates are formed over the semiconductor substrate. FIGS. 20A and 20B through FIGS. 21A and 21B illustrate cross-sectional views of some embodiments corresponding to act 2732.

At 2734, individual source/drain regions are formed in the semiconductor substrate. FIGS. 22A-22B illustrate cross-sectional views of some embodiments corresponding to act 2734.

At 2736, an interconnect structure is formed over the semiconductor substrate. FIGS. 23A and 23B through FIGS. 26A and 26B illustrate cross-sectional views of some embodiments corresponding to act 2736.

In some embodiments, the present application provides a method for forming a semiconductor device. The method includes forming a pad stack over a semiconductor substrate, there the pad stack comprises a lower pad layer and an upper pad layer. The upper pad layer and the lower pad layer are patterned into a patterned upper pad layer and a patterned lower pad layer, respectively. An isolation structure is formed in the semiconductor substrate, where the isolation structure includes a pair of isolation segments separated by the patterned upper pad layer and the patterned lower pad layer. The patterned upper pad layer is removed to form an opening between the isolation segments, where sidewalls of the isolation segments are slanted at a first angle relative to an upper surface of the patterned lower pad layer. A first etch is performed to partially remove the patterned lower pad layer exposed from the opening, and to partially remove the isolation segments through the opening so the sidewalls of the isolation segments are slanted at a second angle greater than the first angle. A second etch is performed to round the sidewalls of the isolation segments and to remove the patterned lower pad layer exposed from the opening. A floating gate is formed in the opening.

In other embodiments, the present application provides a method for forming a semiconductor device. A pad stack is formed over a semiconductor substrate, where the pad stack includes a lower pad layer and an upper pad layer. The upper pad layer and the lower pad layer are patterned into a patterned upper pad layer and a patterned lower pad layer, respectively. An isolation structure is formed in the semiconductor substrate, where the isolation structure includes a first isolation structure segment and a second isolation structure segment separated by the patterned upper pad layer and the patterned lower pad layer. The patterned upper pad layer is removed to form an opening between the first isolation structure segment and the second isolation structure segment, where the opening is defined by opposing sidewalls of the first and second isolation structure segments. A first etch is performed to partially remove the lower pad layer between the first and second isolation structure segments, and to partially remove the first and second isolation structure segments through the opening, where the first etch increases a lateral separation between the opposing sidewalls more at a top of the opening than at a bottom of the opening. A second etch is performed to arch the opposing sidewalls and to remove the patterned lower pad layer between the first and second isolation structure segments. A first floating gate is formed between the first and second isolation structure segments.

In yet other embodiments, the present application provides a semiconductor device. The semiconductor device includes a semiconductor substrate having a first source/drain region and a second source/drain region, where the first source/drain region and the second source/drain region are spaced apart in a first direction. An erase gate is disposed over the first source/drain region. A control gate is disposed over the semiconductor substrate and between the first source/drain region and the second source/drain region. A select gate is disposed over the semiconductor substrate and between the second source/drain region and the control gate. A floating gate is disposed beneath the control gate and between the select gate and the erase gate, where the floating gate has a bottom surface that is substantially planar in a second direction transverse the first direction, and where the floating gate has a first pair of arching sidewalls spaced apart in the second direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a semiconductor substrate having a first source/drain region and a second source/drain region, wherein the first source/drain region and the second source/drain region are spaced apart in a first direction;
   an erase gate disposed over the first source/drain region;
   a control gate disposed over the semiconductor substrate and between the first source/drain region and the second source/drain region;
   a select gate disposed over the semiconductor substrate and between the second source/drain region and the control gate;
   a floating gate disposed beneath the control gate and between the select gate and the erase gate, wherein the floating gate has a first arced sidewall and a second arced sidewall that are spaced apart in a second direction transverse the first direction, wherein the floating gate has a bottom surface that extends in the second direction from the first arced sidewall to the second arced sidewall, and wherein the bottom surface is substantially planar;
   a floating gate dielectric structure lining the bottom surface, the first arced sidewall, and the second arced sidewall; and
   a first isolation structure disposed in the semiconductor substrate and on a side of the floating gate, wherein an upper surface of the first isolation structure is substantially aligned with an upper surface of the floating gate along a lateral plane, wherein the lateral plane is vertically spaced from the semiconductor substrate, wherein the first isolation structure has a sidewall that contacts a sidewall of the floating gate dielectric structure, wherein both the sidewall of the first isolation structure and the sidewall of the floating gate dielectric structure are arced, and wherein the sidewall of the first isolation structure arcs continuously from the upper surface of the first isolation structure to below the bottom surface of the floating gate.

2. The semiconductor device of claim 1, wherein:
   the floating gate has a cross-sectional profile taken along a vertical plane that intersects the lateral plane;
   the cross-sectional profile of the floating gate has a central portion that is rectangular-shaped;
   the cross-sectional profile of the floating gate has peripheral portions that are disposed on opposite sides of the central portion; and
   the peripheral portions are semicircle-shaped and arc away from the central portion in opposite directions.

3. The semiconductor device of claim 1, wherein both the first arced sidewall and the second arced sidewall continuously arc from the bottom surface to the upper surface of the floating gate.

4. The semiconductor device of claim 1, wherein:
   both the first arced sidewall and the second arced sidewall continuously extend from the bottom surface to the upper surface of the floating gate;
   the upper surface of the floating gate extends a first distance in the second direction from the first arced sidewall to the second arced sidewall;
   the bottom surface extends a second distance in the second direction from the first arced sidewall to the second arced sidewall; and
   the first distance and the second distance are substantially the same.

5. The semiconductor device of claim 1, further comprising:
   a second isolation structure disposed in the semiconductor substrate and spaced from the first isolation structure in the second direction, wherein the floating gate is disposed between the first isolation structure and the second isolation structure.

6. The semiconductor device of claim 5, wherein an upper surface of the floating gate dielectric structure, an upper surface of the second isolation structure, the upper surface of the floating gate, and the upper surface of the first isolation structure are substantially aligned along the lateral plane.

7. The semiconductor device of claim 5, wherein the floating gate dielectric structure directly contacts the first isolation structure and the second isolation structure.

8. The semiconductor device of claim 7, wherein the floating gate dielectric structure directly contacts the bottom surface, the first arced sidewall, the sidewall of the first isolation structure, and the second arced sidewall.

9. The semiconductor device of claim 1, wherein a bottommost surface of the first isolation structure is disposed below a bottommost surface of the floating gate dielectric structure.

10. A semiconductor device comprising:
    a semiconductor substrate having a first source/drain region and a second source/drain region, wherein the first source/drain region and the second source/drain region are spaced apart in a first direction;
    a control gate disposed over the semiconductor substrate and between the first source/drain region and the second source/drain region;

a select gate disposed over the semiconductor substrate and between the second source/drain region and the control gate;
a floating gate disposed below the control gate and between the first source/drain region and the second source/drain region, wherein:
  the control gate at least partially overlies the floating gate;
  the floating gate has a first sidewall and a second sidewall that are spaced apart in a second direction transverse the first direction;
  the floating gate has a bottom surface that extends in the second direction from the first sidewall to the second sidewall;
  the first sidewall is arced and arcs continuously from the bottom surface to an upper surface of the floating gate; and
  the second sidewall is arced and arcs continuously from the bottom surface to the upper surface of the floating gate; and
a floating gate dielectric structure lining the bottom surface, the first sidewall, and the second sidewall; and
an isolation structure disposed in the semiconductor substrate and on a side of the floating gate dielectric structure, wherein an upper surface of the floating gate dielectric structure is substantially aligned with an uppermost surface of the isolation structure along a lateral plane, and wherein the lateral plane is vertically spaced from the semiconductor substrate, wherein the uppermost surface of the isolation structure is disposed directly over a portion of the floating gate dielectric structure.

11. The semiconductor device of claim 10, wherein the bottom surface is substantially planar.

12. The semiconductor device of claim 10, wherein:
the floating gate has a cross-sectional profile taken along a vertical plane that intersects the lateral plane;
the cross-sectional profile of the floating gate has a central portion that is rectangular-shaped;
the cross-sectional profile of the floating gate has peripheral portions that are disposed on opposite sides of the central portion; and
the peripheral portions are semicircle-shaped and arc away from the central portion in opposite directions.

13. The semiconductor device of claim 10, wherein:
the floating gate comprises a central portion, a first peripheral portion, and a second peripheral portion;
the central portion is disposed between the first peripheral portion and the second peripheral portion and extends continuously from the first peripheral portion to the second peripheral portion;
a cross-sectional profile of the first peripheral portion is semicircle-shaped;
a cross-sectional profile of the second peripheral portion is semicircle-shaped; and
a difference between a maximum height of the central portion and a minimum height of the central portion is less than or equal to 10 angstroms.

14. The semiconductor device of claim 10, wherein a bottommost surface of the isolation structure is disposed below a bottommost surface of the floating gate dielectric structure.

15. A semiconductor device comprising:
a semiconductor substrate having a first source/drain region and a second source/drain region, wherein the first source/drain region and the second source/drain region are spaced apart in a first direction;
a control gate disposed over the semiconductor substrate and between the first source/drain region and the second source/drain region;
a select gate disposed over the semiconductor substrate and between the second source/drain region and the control gate;
a floating gate disposed below the control gate and between the first source/drain region and the second source/drain region, wherein the control gate at least partially overlies the floating gate, and wherein the floating gate has a first outer sidewall and a second outer sidewall that are spaced apart in a second direction transverse the first direction, and wherein both the first outer sidewall and the second outer sidewall are arced;
a floating gate dielectric layer lining a bottom surface of the floating gate, the first outer sidewall, and the second outer sidewall, wherein the floating gate dielectric layer has a first inner sidewall that engages the first outer sidewall and a second inner sidewall that engages the second outer sidewall, wherein both the first inner sidewall and the second inner sidewall are arced;
a first isolation structure and a second isolation structure disposed in the semiconductor substrate, wherein the first and second isolation structures are spaced apart in the second direction and disposed on opposite sides of the floating gate dielectric layer, wherein the first isolation structure has a sidewall that arcs away from a center point of the floating gate, wherein the second isolation structure has a sidewall that arcs away from the center point of the floating gate, wherein the sidewall of the first isolation structure and the sidewall of the second isolation structure are spaced apart in the second direction, and wherein both the sidewall of the first isolation structure and the sidewall of the second isolation structure arc continuously from a lateral plane that is substantially aligned with an upper surface of the floating gate to below the floating bate; and
a control gate dielectric layer disposed vertically between the floating gate and the control gate, wherein a bottom surface of the control gate dielectric layer is substantially planar, and wherein the bottom surface of the control gate dielectric layer engages the floating gate, the floating gate dielectric layer, the first isolation structure, and the second isolation structure.

16. The semiconductor device of claim 15, wherein:
the first inner sidewall continuously arcs from a first upper surface of the floating gate dielectric layer to a second upper surface of the floating gate dielectric layer;
the second inner sidewall continuously arcs from the first upper surface to a third upper surface of the floating gate dielectric layer; and
the floating gate is disposed between the first upper surface and the second upper surface.

17. The semiconductor device of claim 16, wherein the floating gate dielectric layer further comprises:
a third outer sidewall and a fourth outer sidewall that are spaced apart in the second direction, wherein both the third outer sidewall and the fourth outer sidewall are arced, and wherein the first inner sidewall, the second inner sidewall, the third outer sidewall, and the fourth outer sidewall each arc away from the center point of the floating gate.

18. The semiconductor device of claim 17, wherein:
the third outer sidewall continuously arcs from a bottom surface of the floating gate dielectric layer to the second upper surface; and the fourth outer sidewall continuously arcs from the bottom surface of the floating gate dielectric layer to the third upper surface.

19. The semiconductor device of claim 18, wherein:

the sidewall of the first isolation structure directly contacts the third outer sidewall;

both the floating gate and the floating gate dielectric layer are disposed between the first isolation structure and the second isolation structure; and the sidewall of the second isolation structure directly contacts the fourth outer sidewall.

20. The semiconductor device of claim 15, wherein a bottommost surface of the floating gate dielectric layer is disposed over both a bottommost surface of the first isolation structure and a bottommost surface of the second isolation structure.

* * * * *